United States Patent
Zhou

(10) Patent No.: US 9,595,530 B1
(45) Date of Patent: Mar. 14, 2017

(54) METHODS AND APPARATUS FOR VERTICAL BIT LINE STRUCTURES IN THREE-DIMENSIONAL NONVOLATILE MEMORY

(71) Applicant: SanDisk Technologies LLC, Plano, TX (US)

(72) Inventor: Guangle Zhou, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/204,286

(22) Filed: Jul. 7, 2016

(51) Int. Cl.
*H01L 27/24* (2006.01)
*H01L 27/115* (2006.01)

(52) U.S. Cl.
CPC .. *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01); *H01L 27/249* (2013.01); *H01L 27/2436* (2013.01)

(58) Field of Classification Search
CPC ......... H01L 27/11521; H01L 27/11556; H01L 27/11568; H01L 27/11573; H01L 27/249; H01L 27/2436; H01L 27/11526; H01L 27/11582
See application file for complete search history.

(56) References Cited

U.S. PATENT DOCUMENTS 9,443,910 B1 * 9/2016 Fujiwara ............. H01L 27/2481

* cited by examiner

*Primary Examiner* — Roy Potter
*Assistant Examiner* — Paul Patton
(74) *Attorney, Agent, or Firm* — Vierra Magen Marcus LLP

(57) ABSTRACT

A method is provided that includes forming a first vertical bit line disposed in a first direction above a substrate, forming a first word line disposed in a second direction above the substrate, the second direction perpendicular to the first direction, forming a first memory cell comprising a nonvolatile memory material at an intersection of the first vertical bit line and the first word line, forming a transistor above the substrate, and forming a first bit line select device coupled between the first vertical bit line and the transistor.

20 Claims, 32 Drawing Sheets

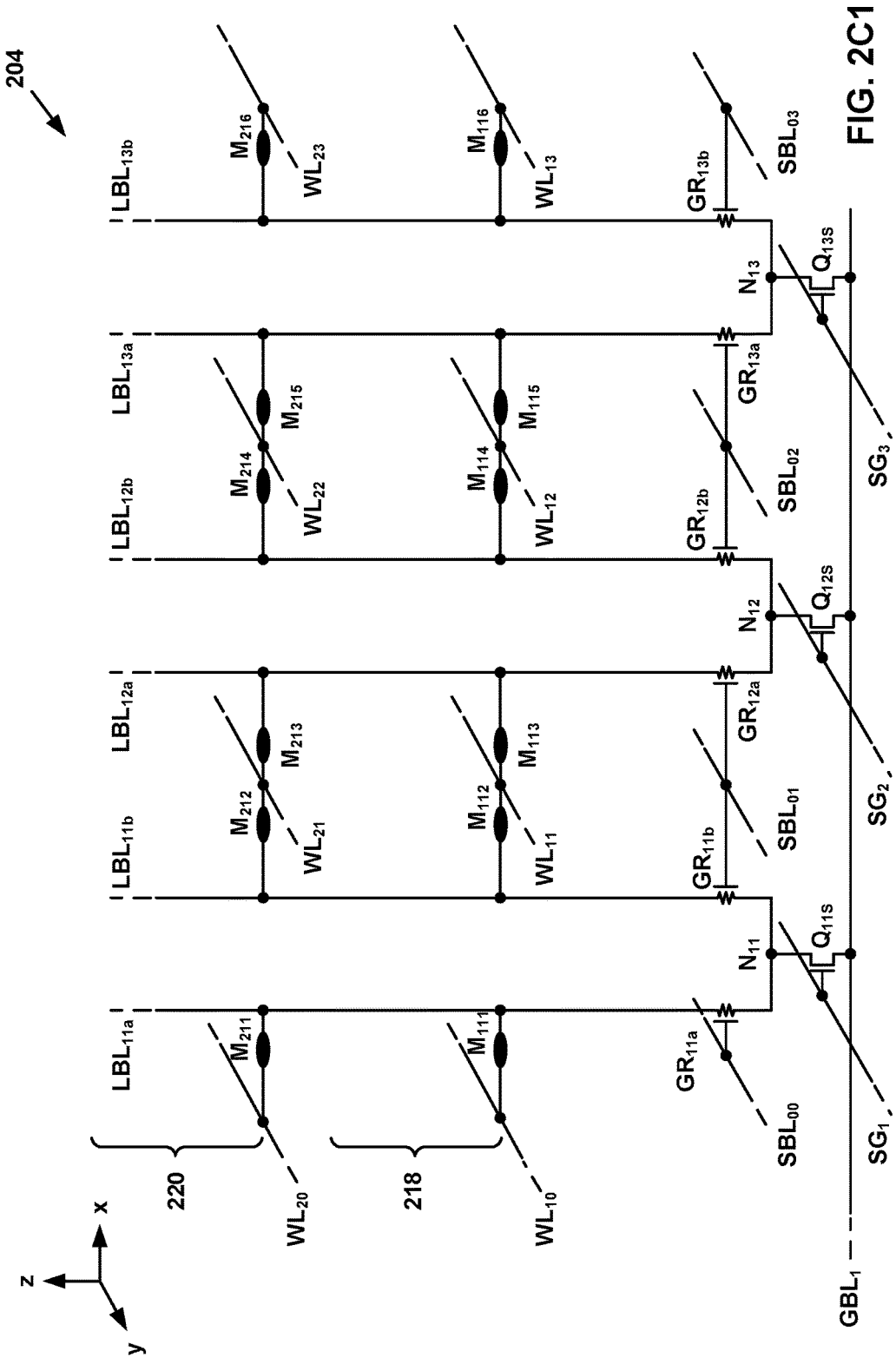
FIG. 2C1

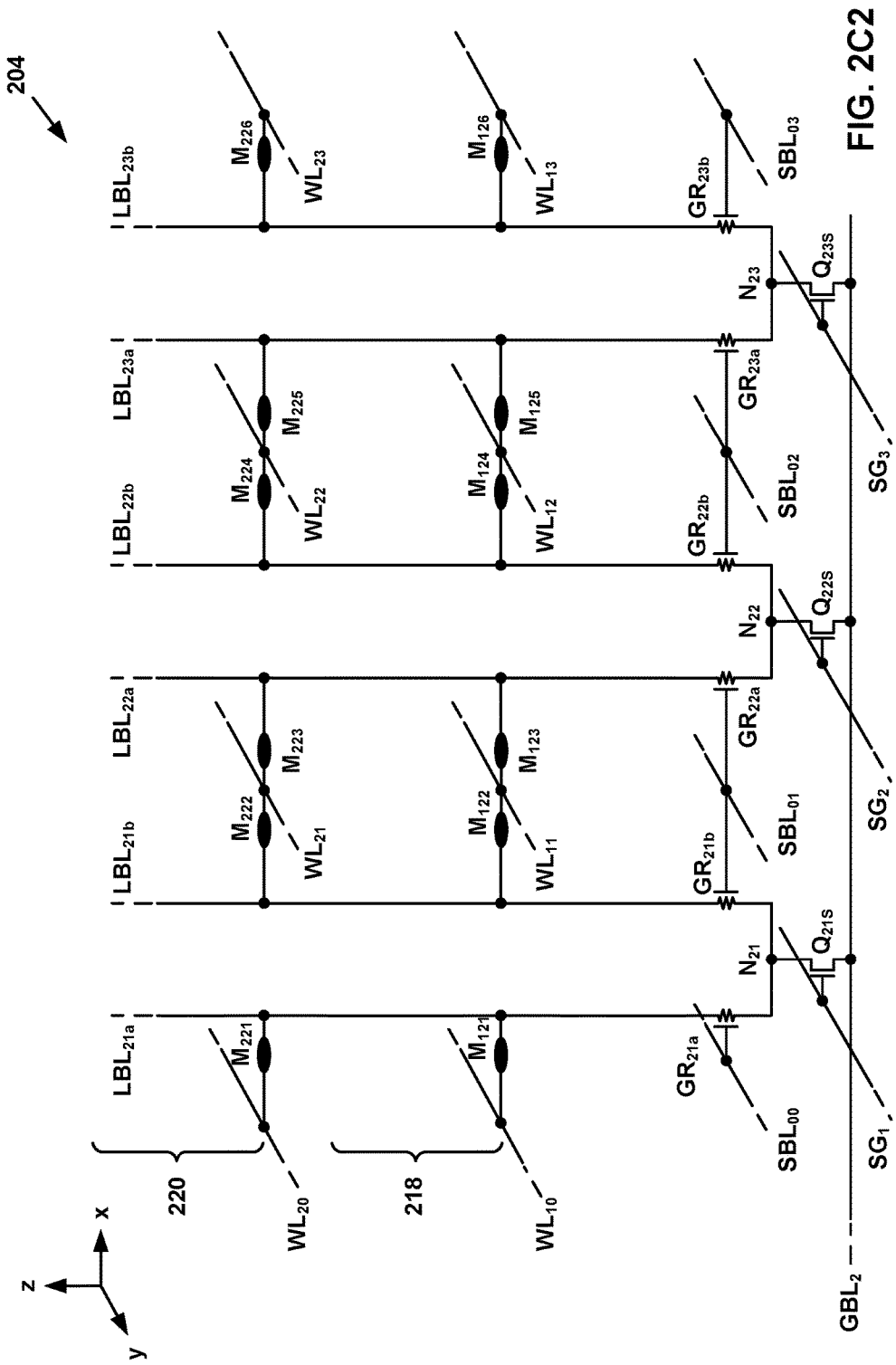
FIG. 2C2

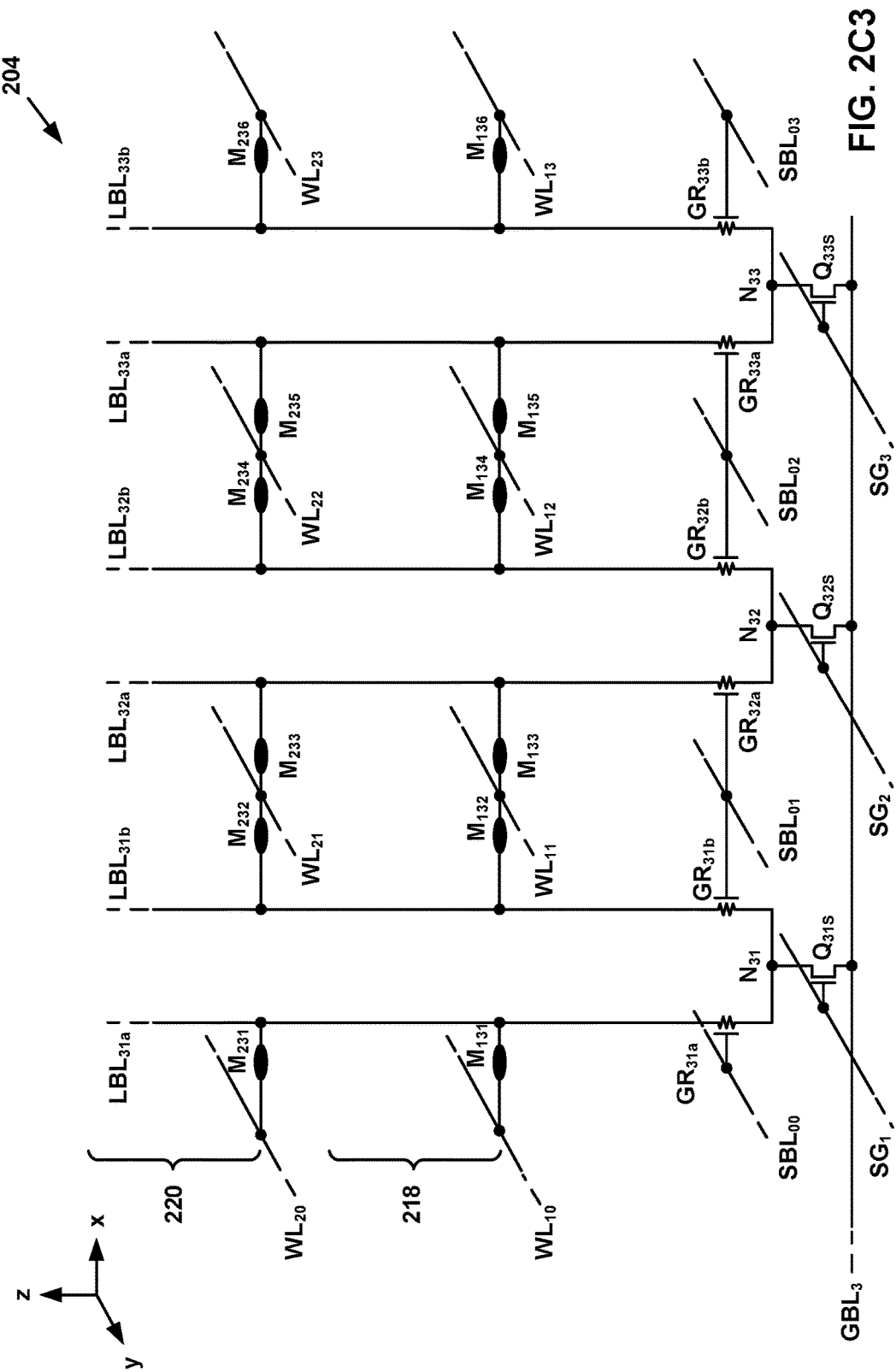
FIG. 2C3

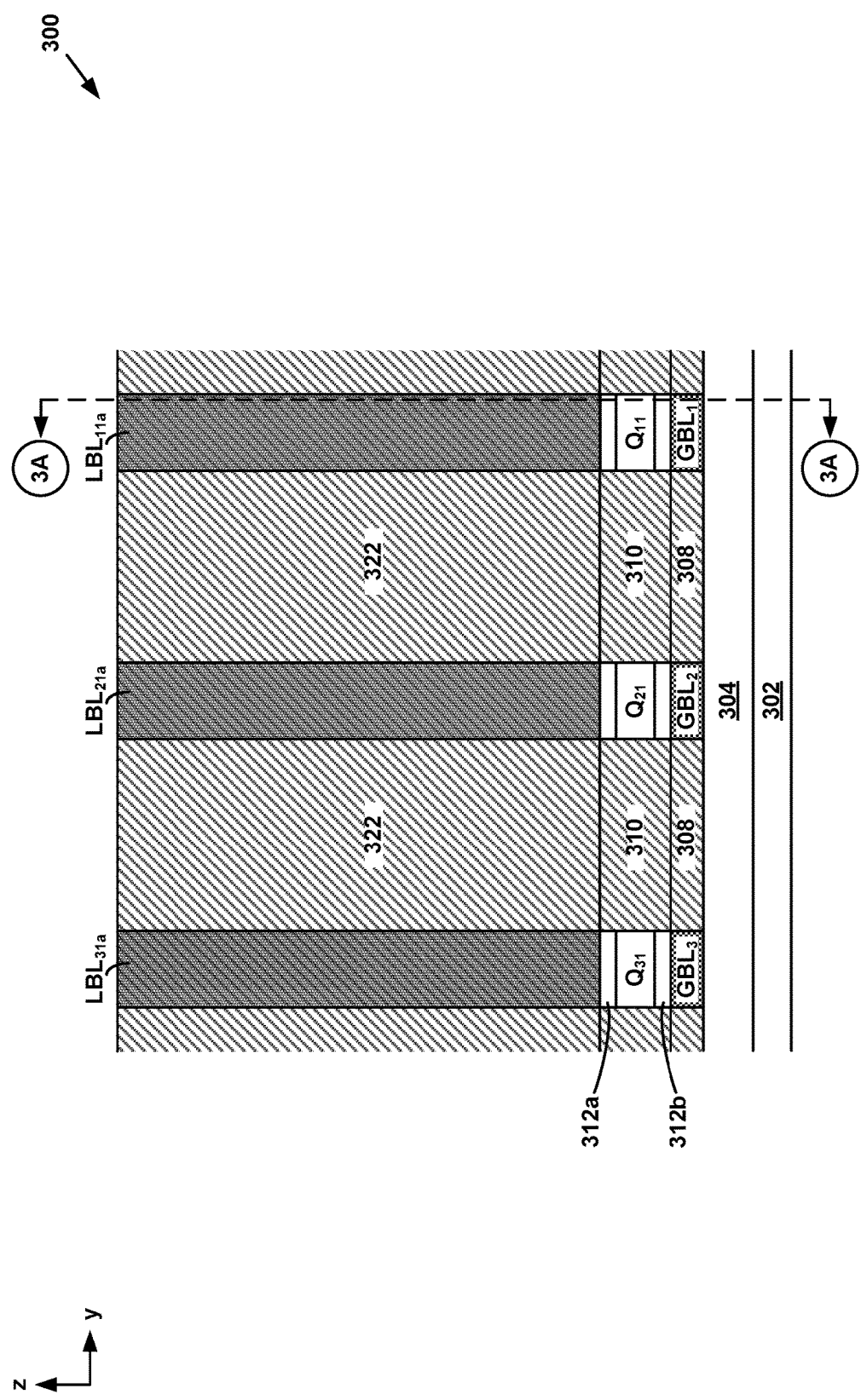

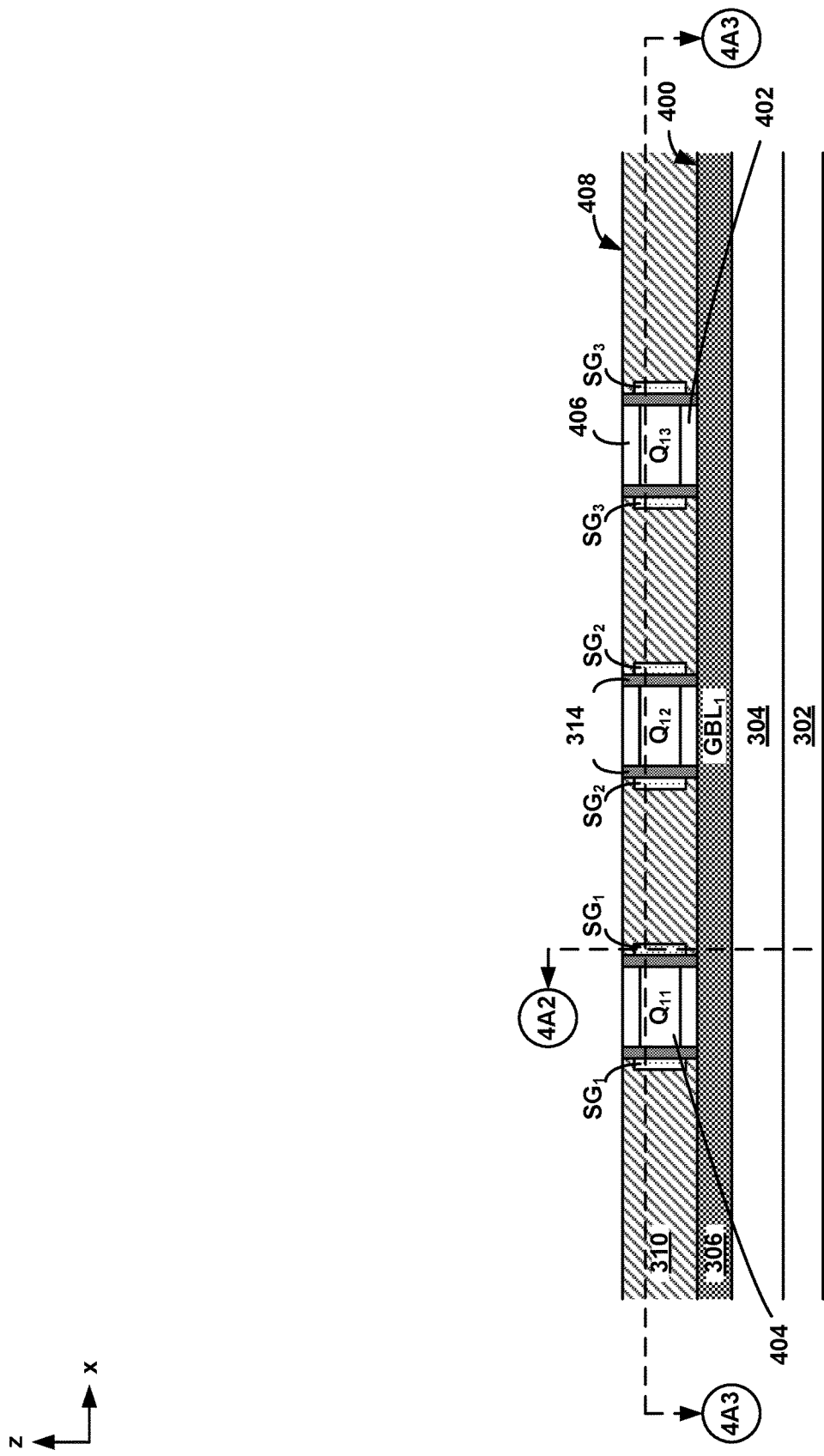
FIG. 4A1

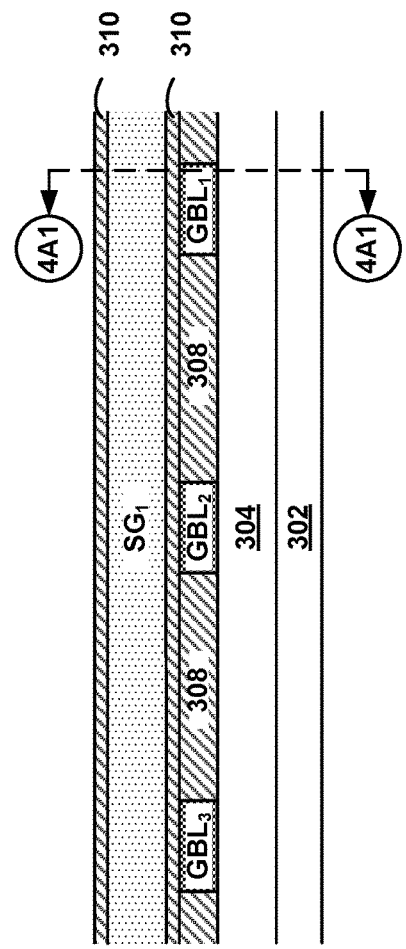
FIG. 4A2

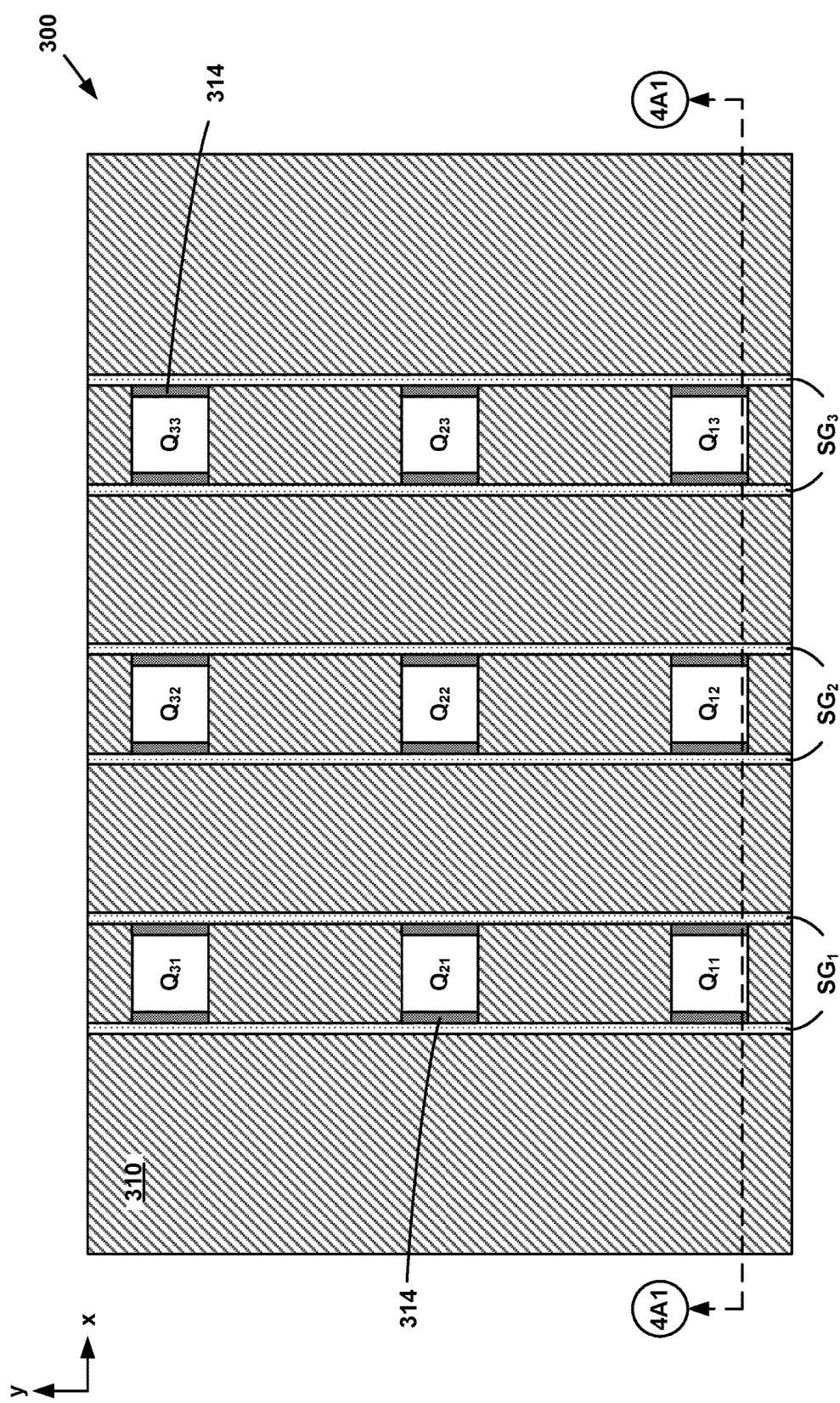

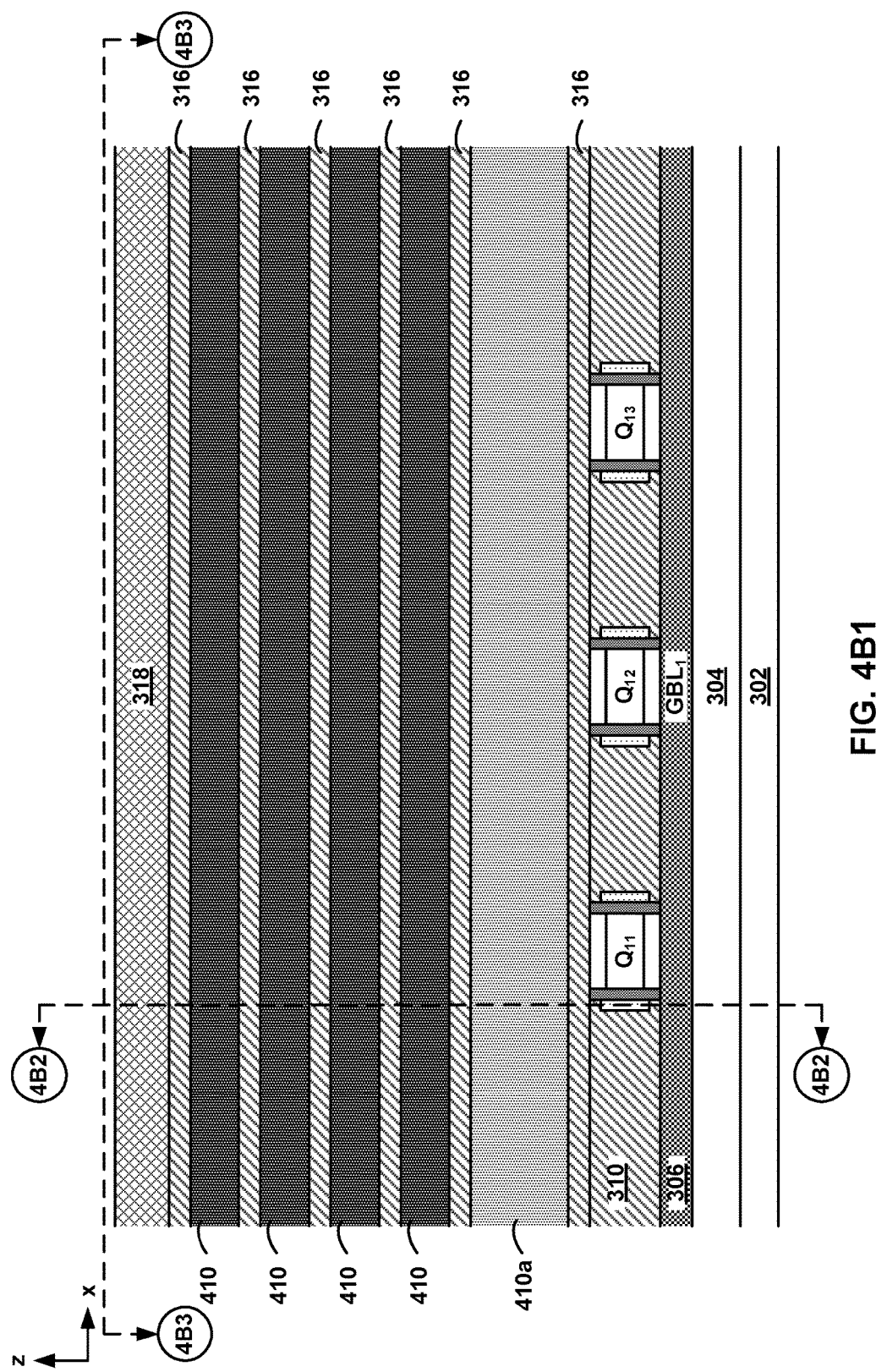
FIG. 4B1

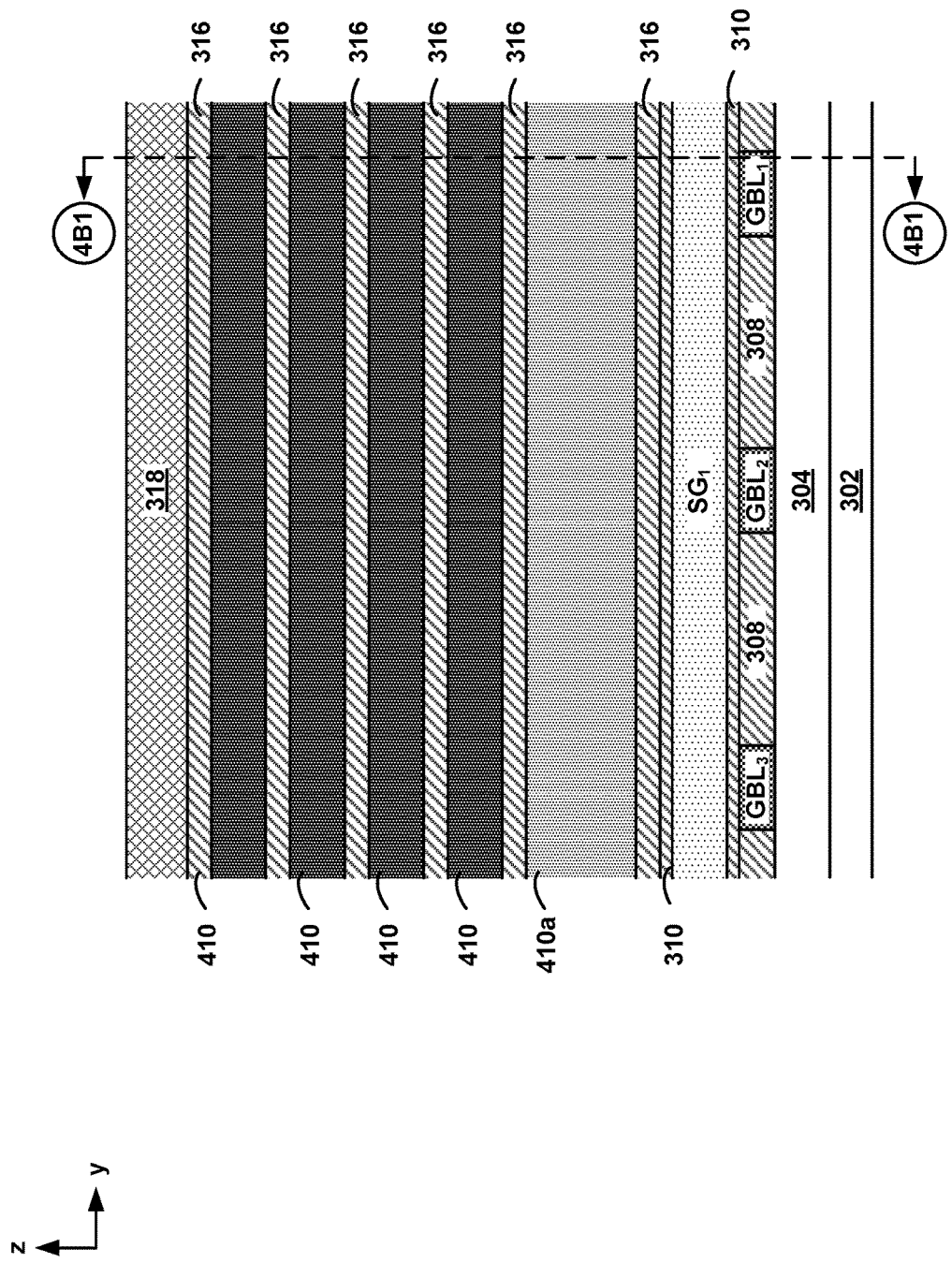
FIG. 4B2

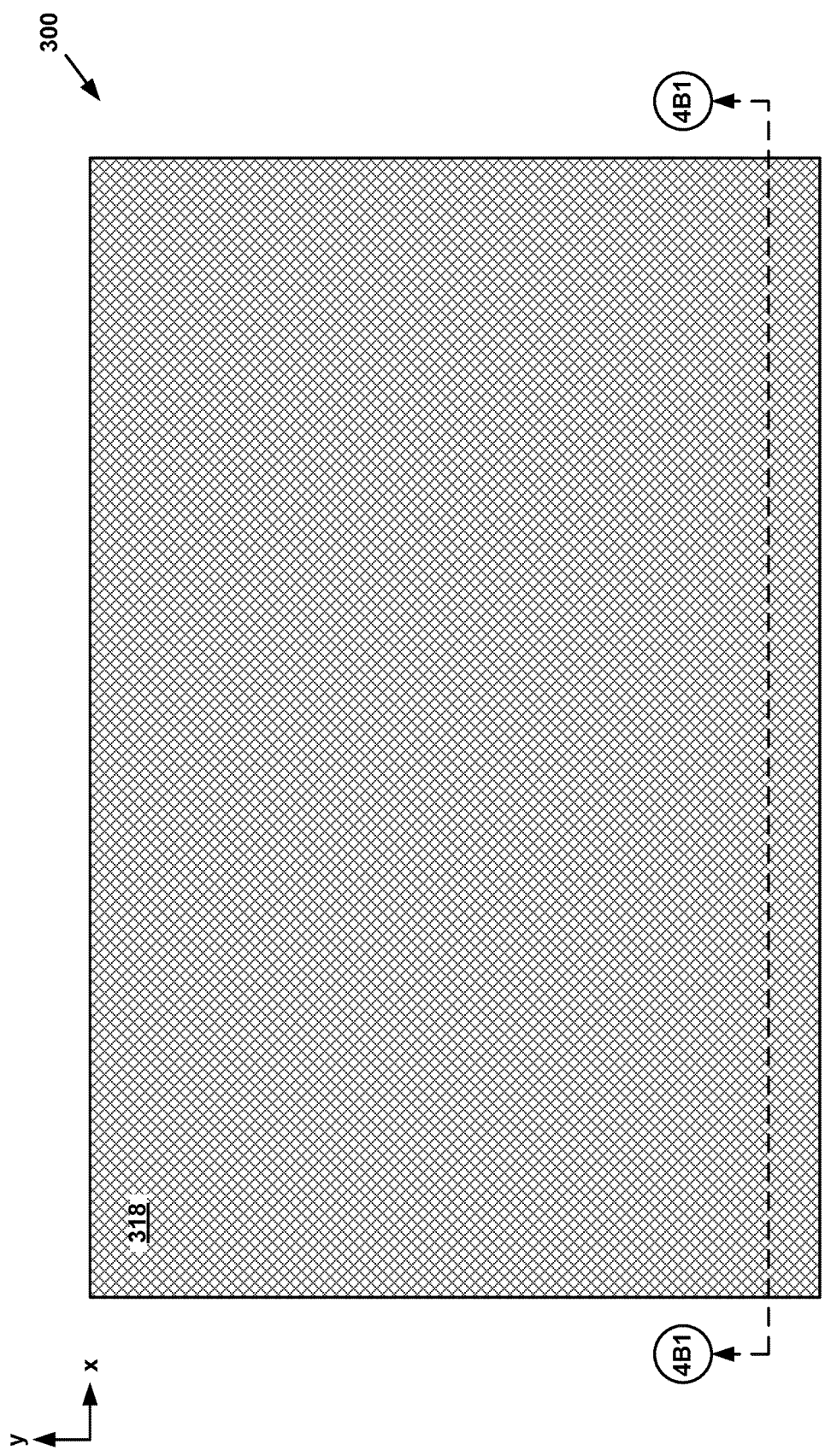
FIG. 4B3

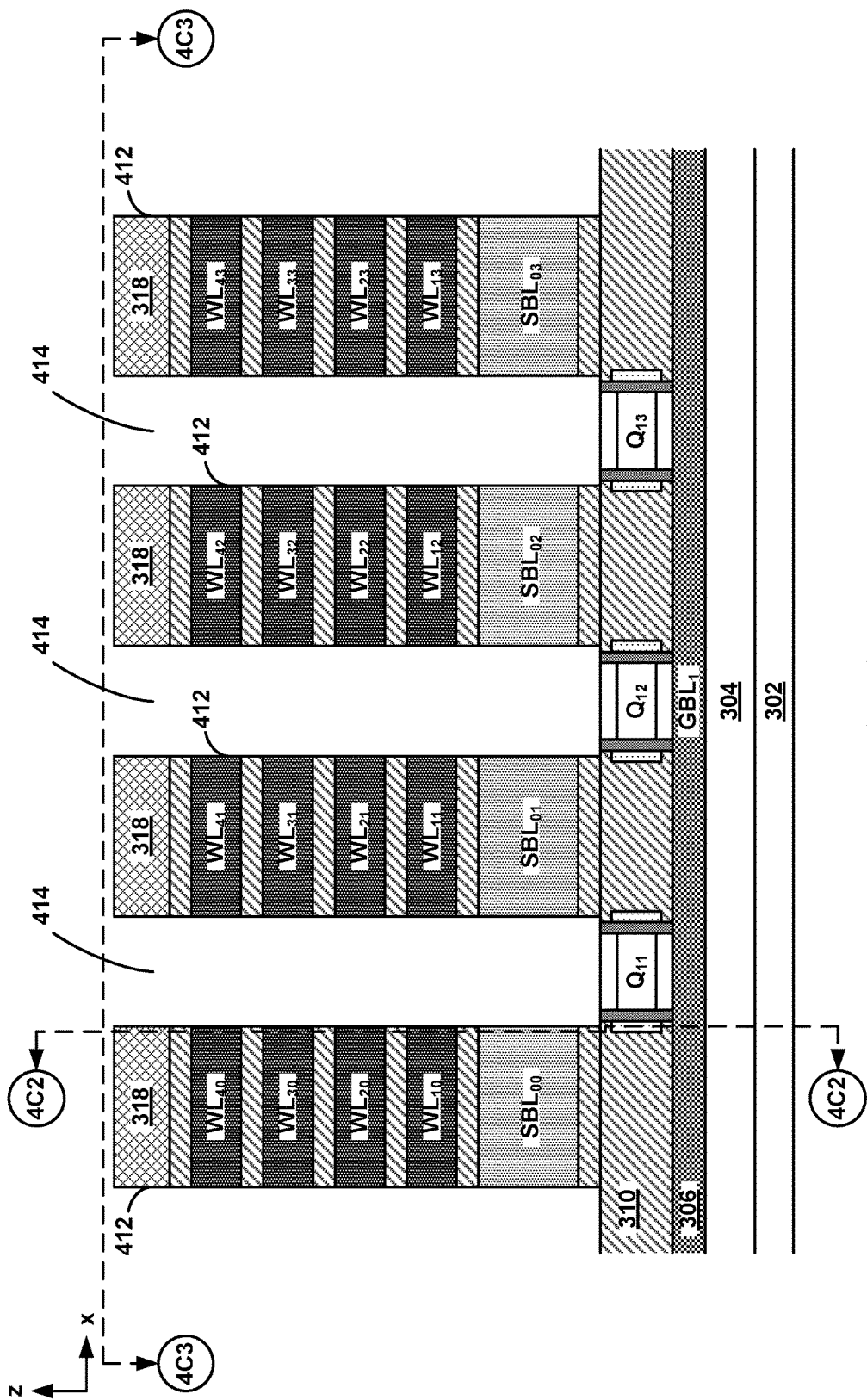
FIG. 4C1

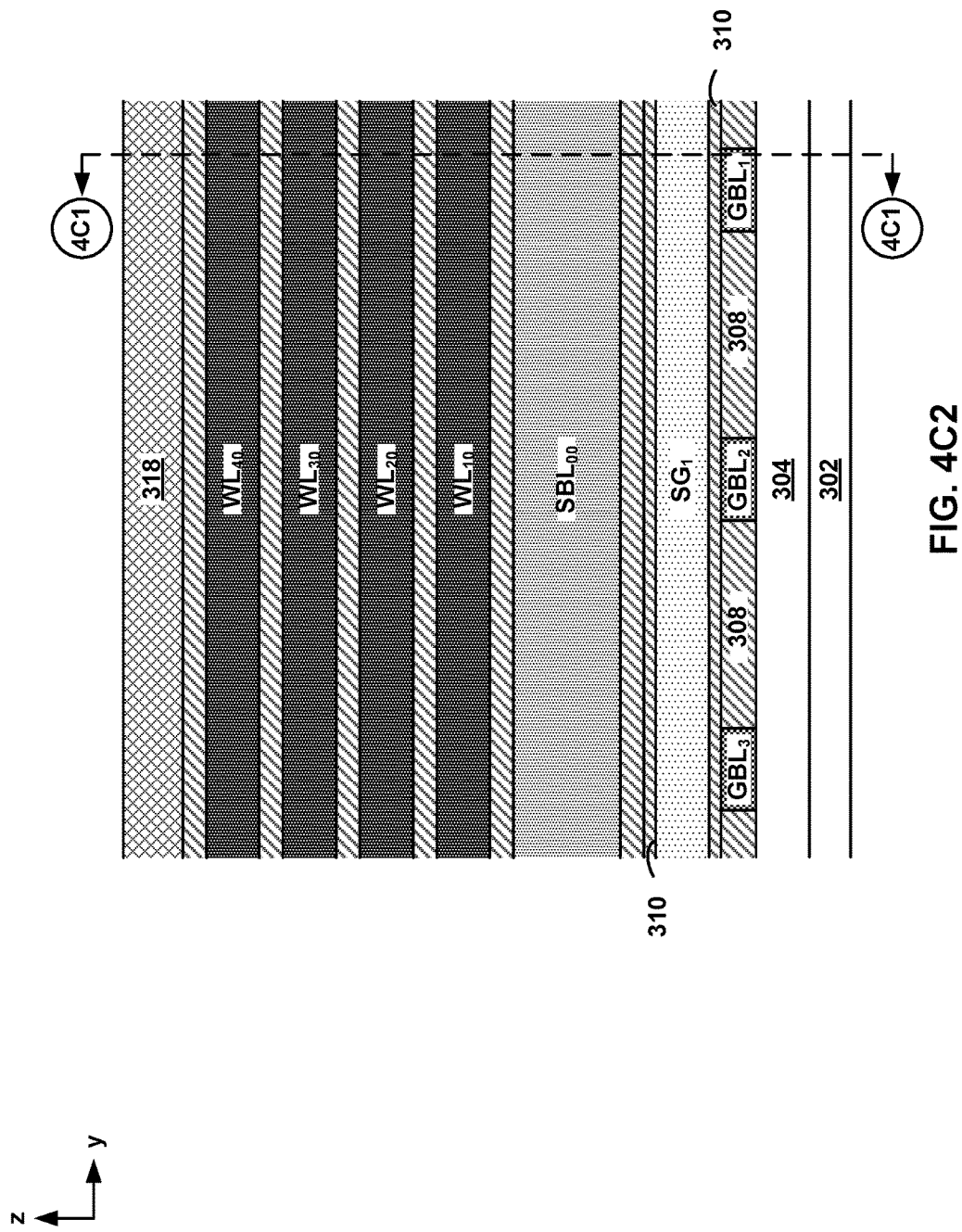
FIG. 4C2

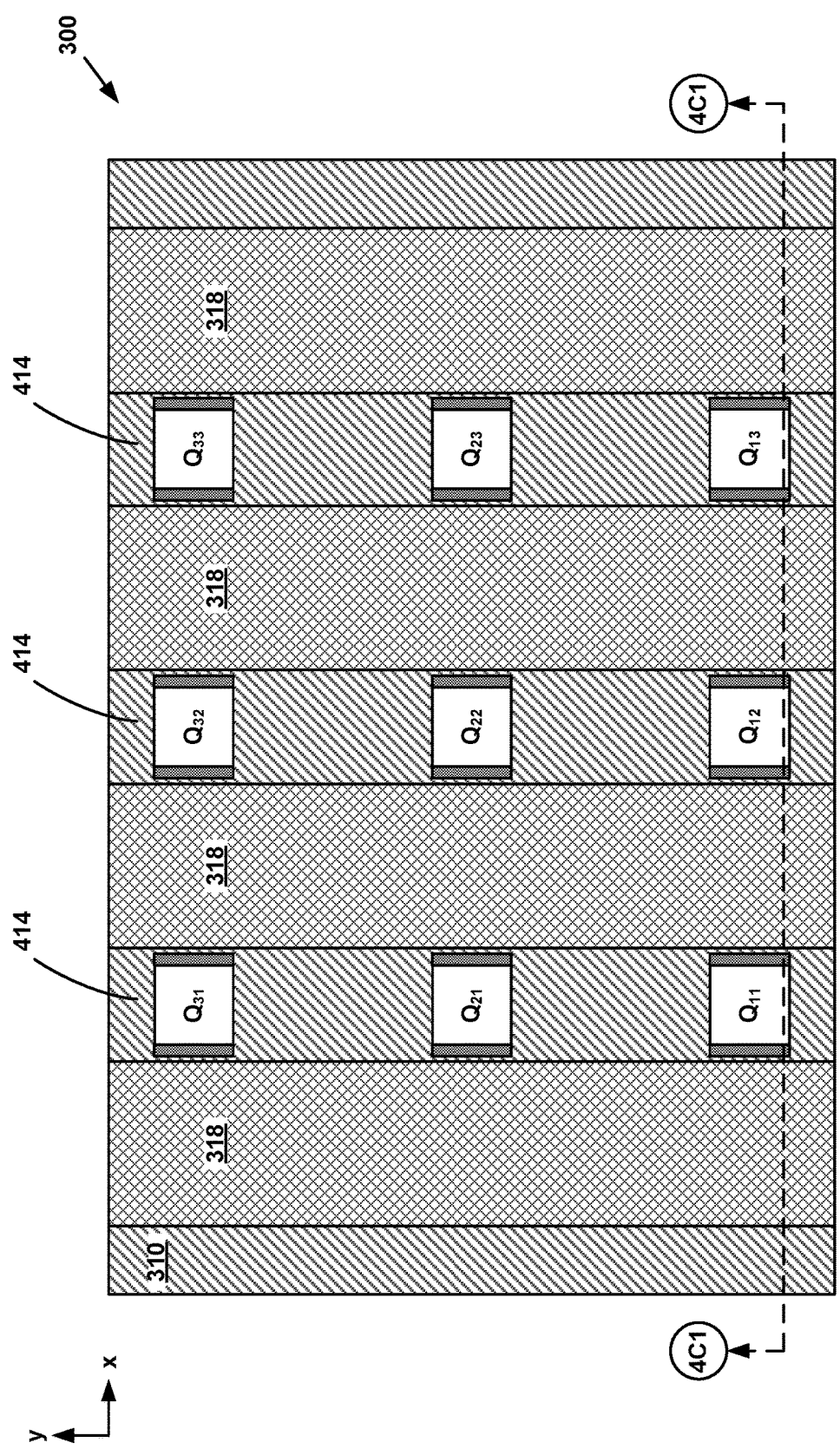
FIG. 4C3

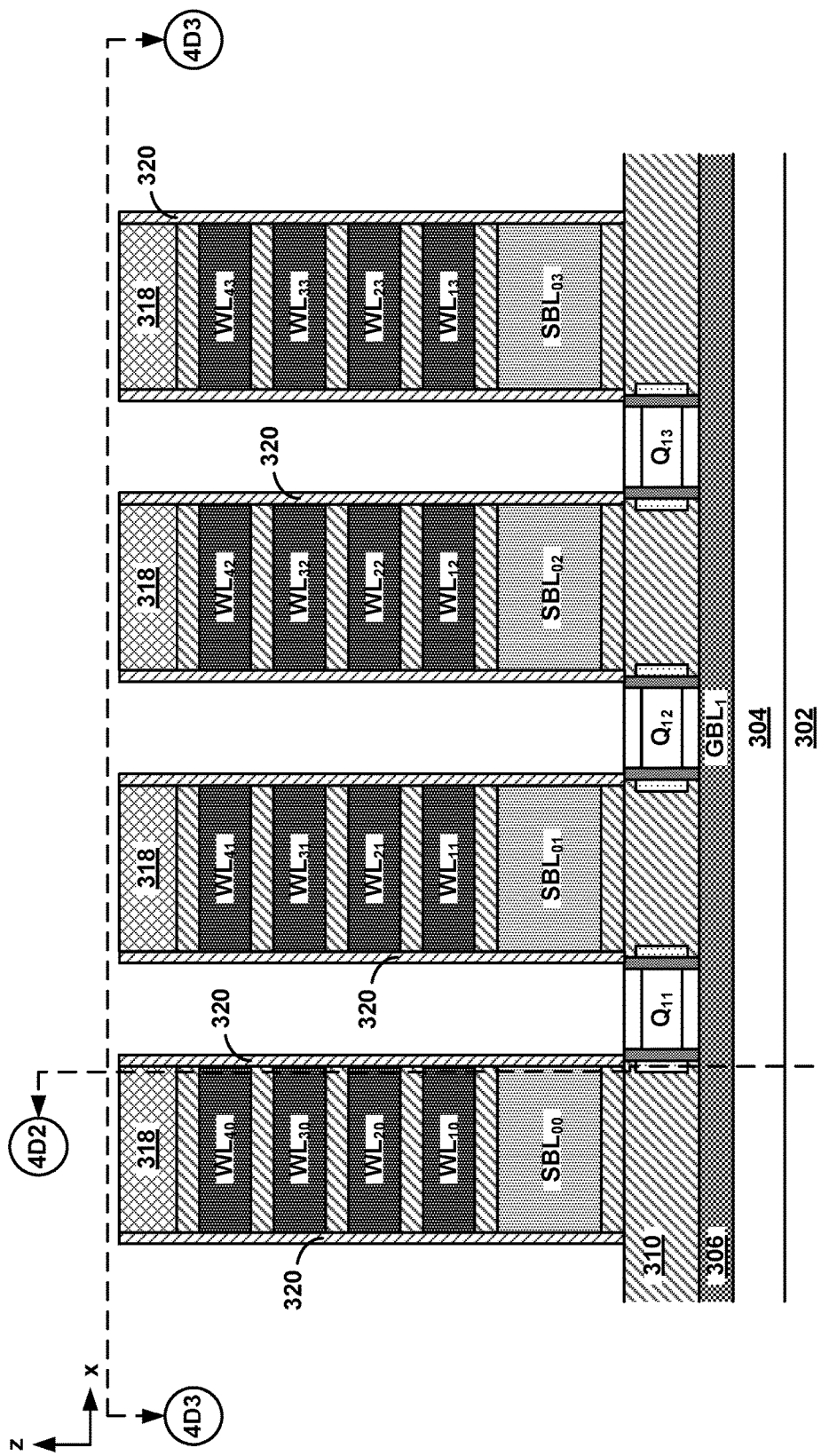
FIG. 4D1

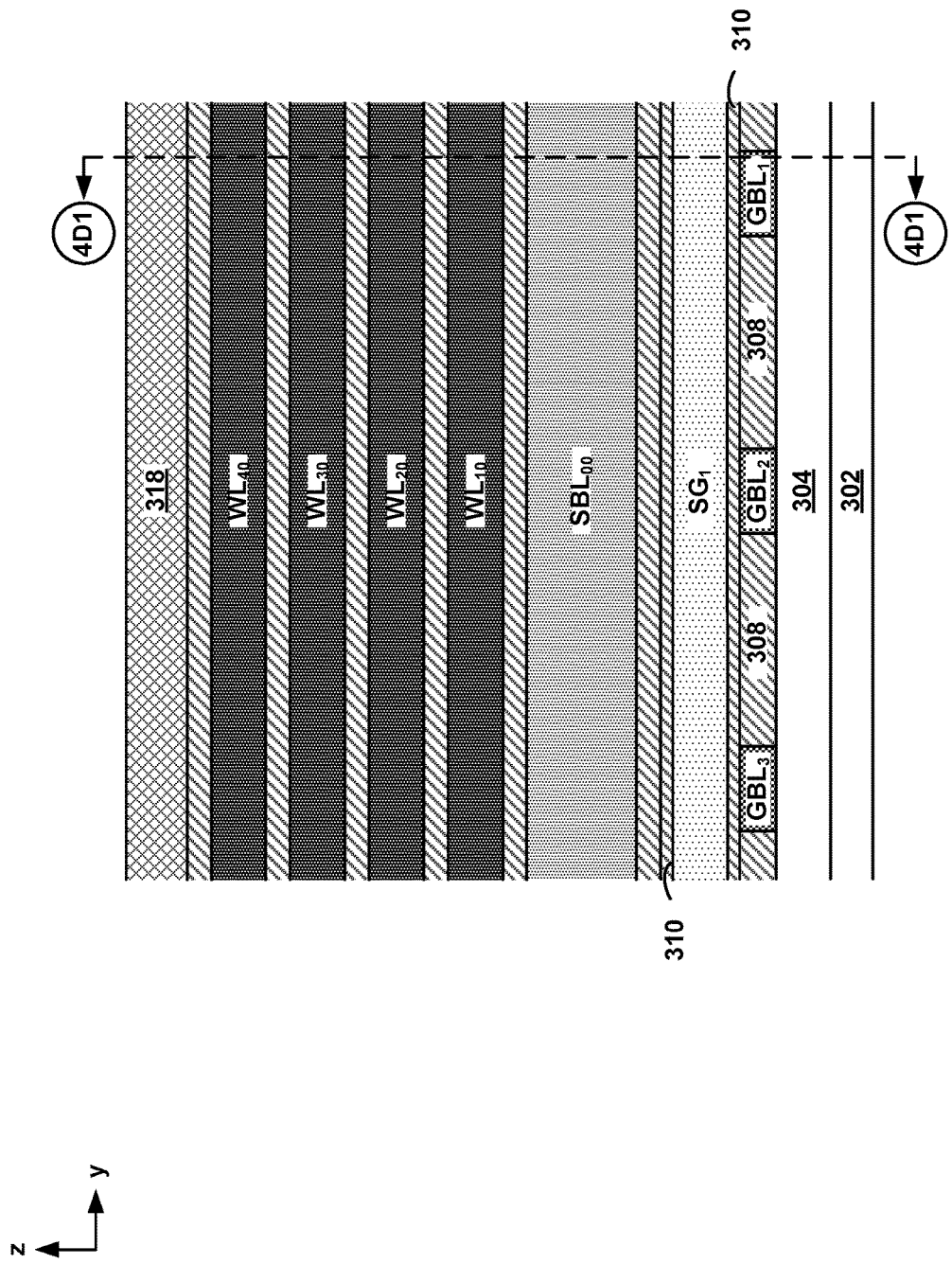
FIG. 4D2

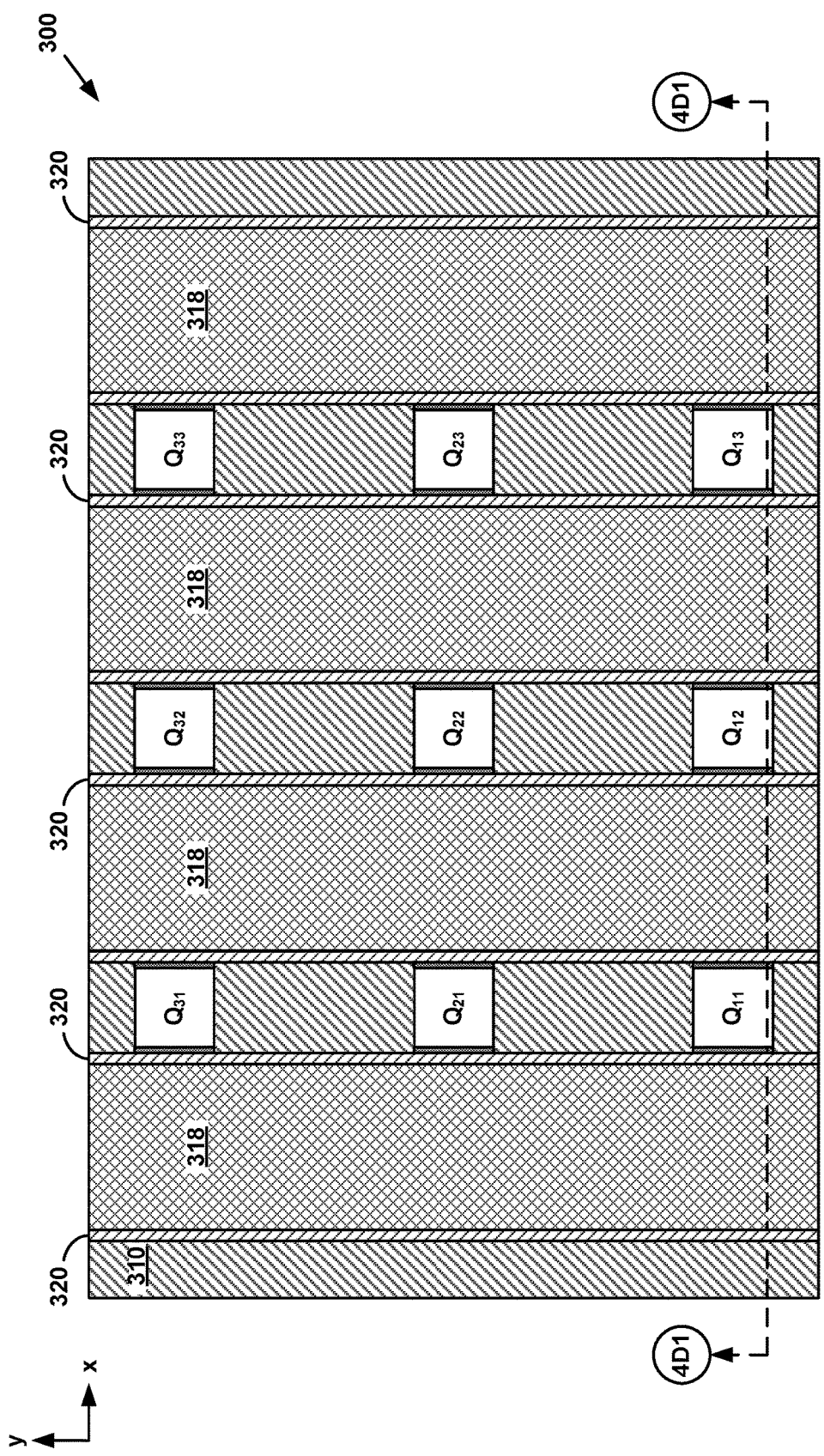
FIG. 4D3

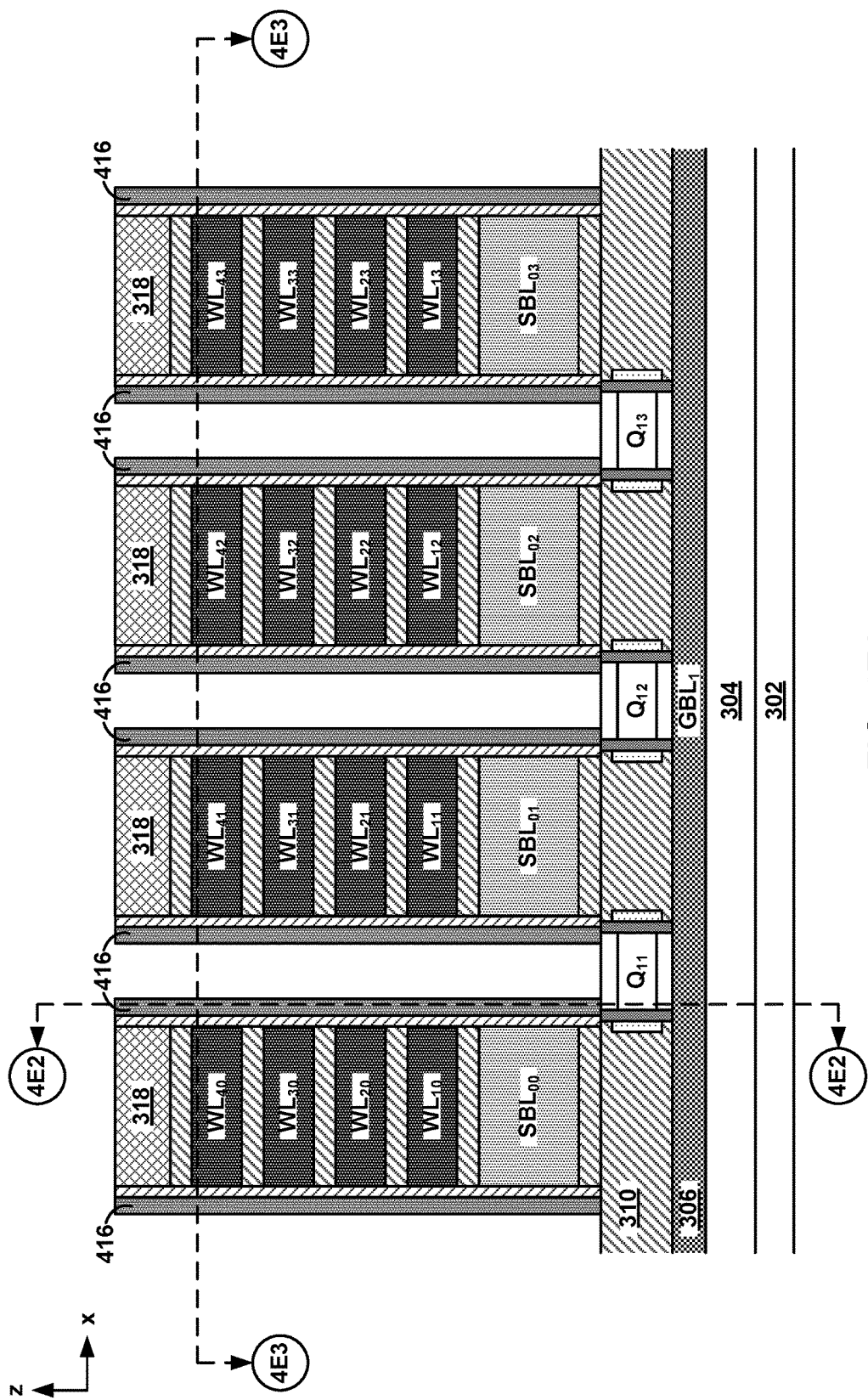
FIG. 4E1

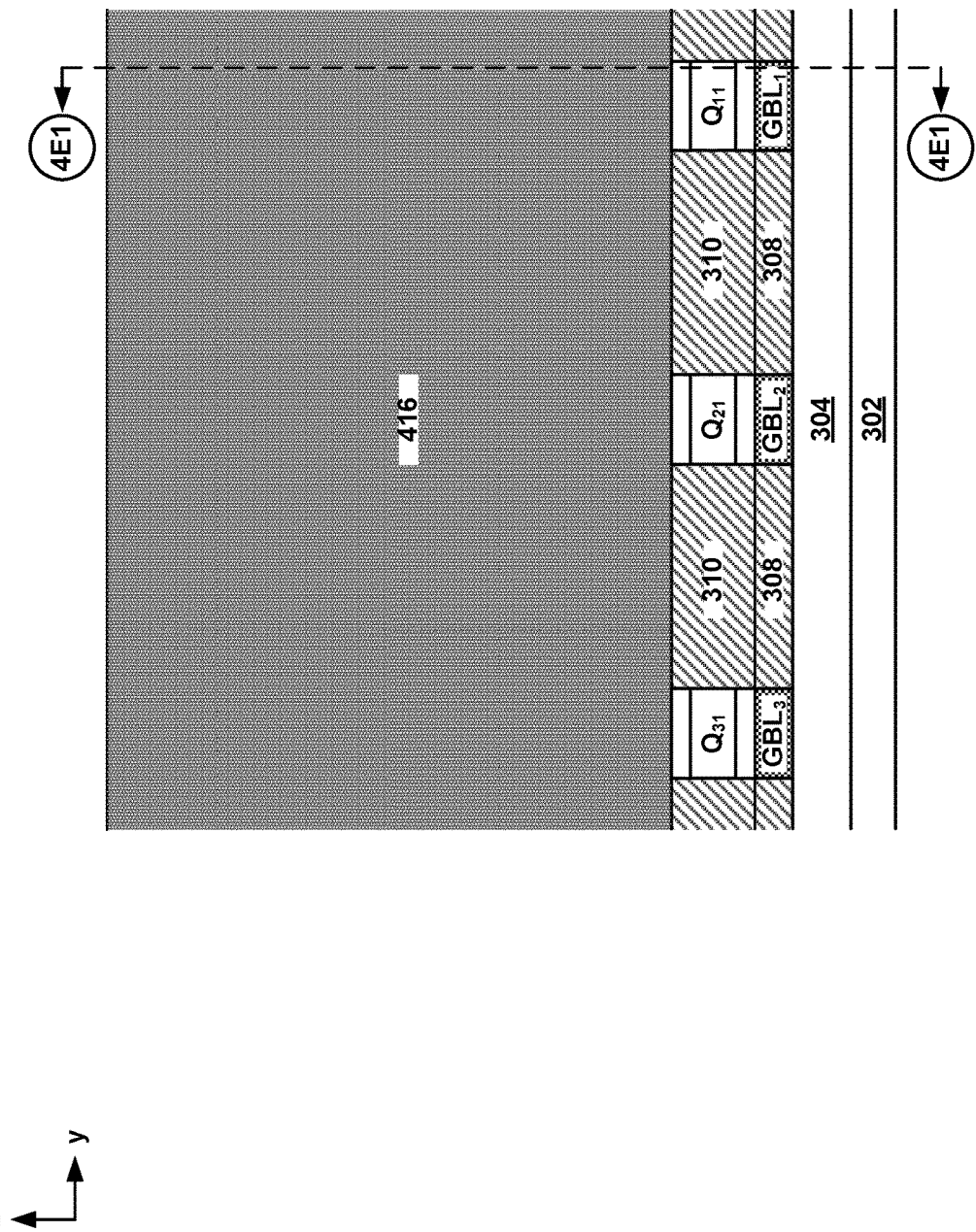
FIG. 4E2

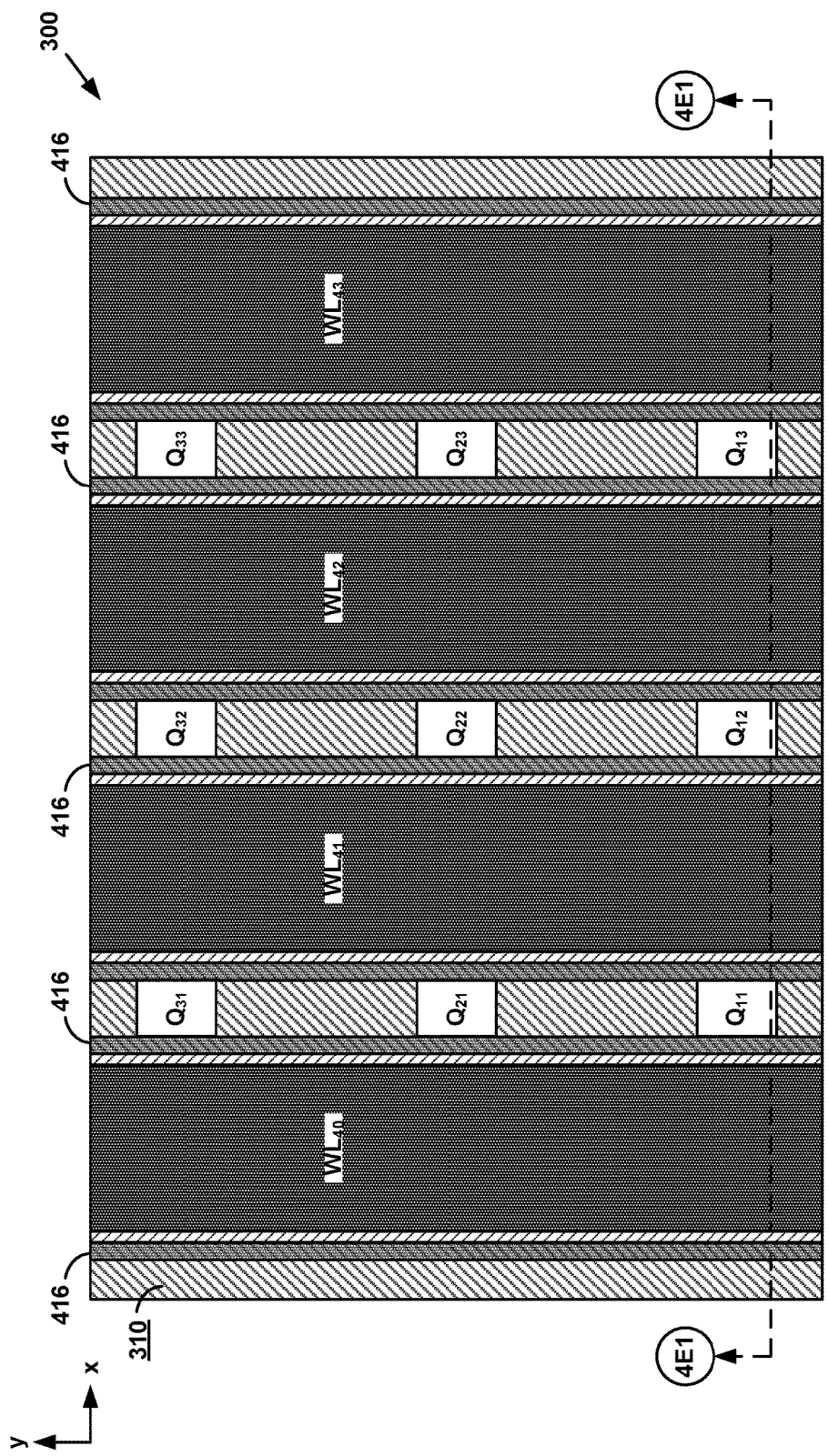
FIG. 4E3

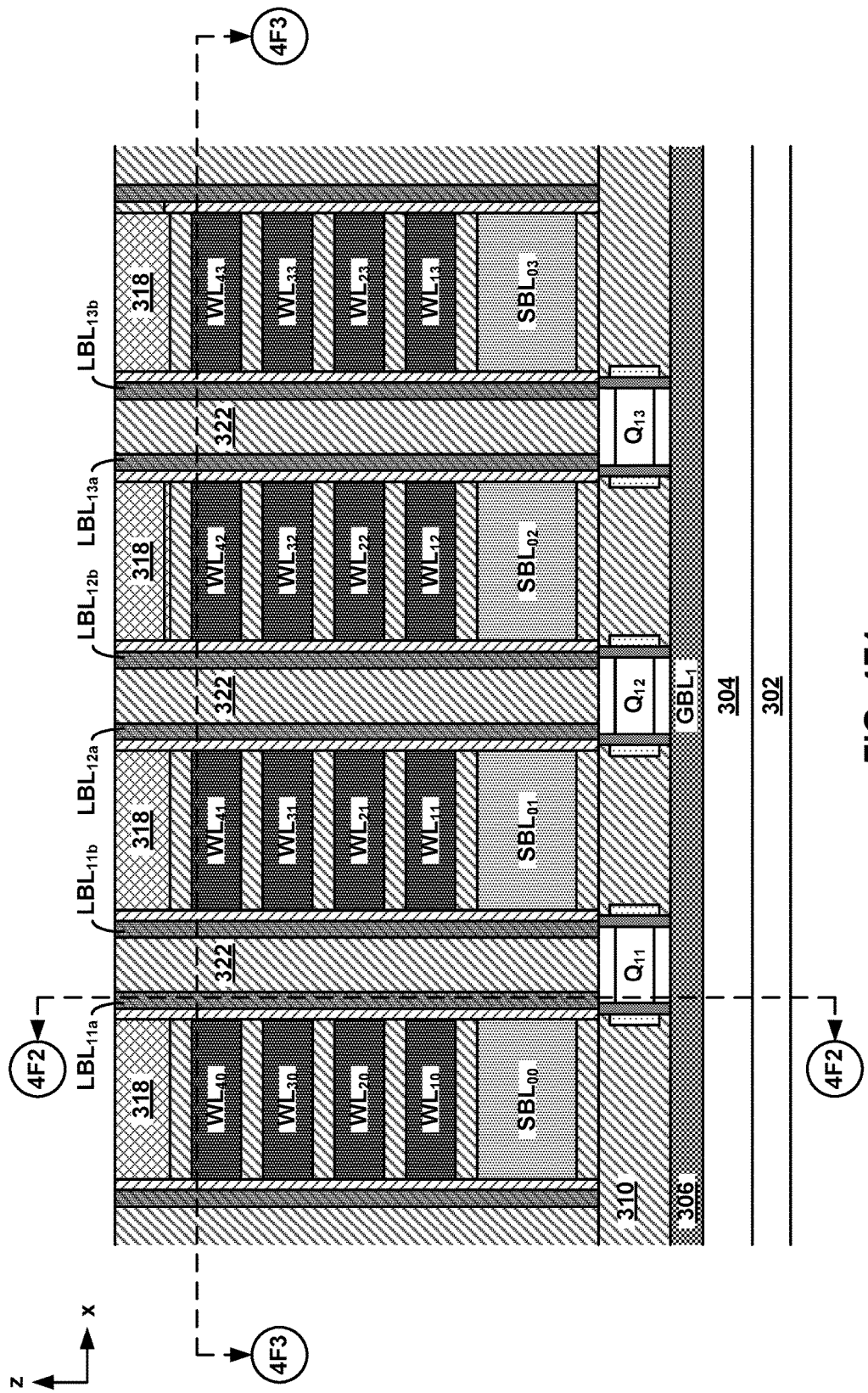
FIG. 4F1

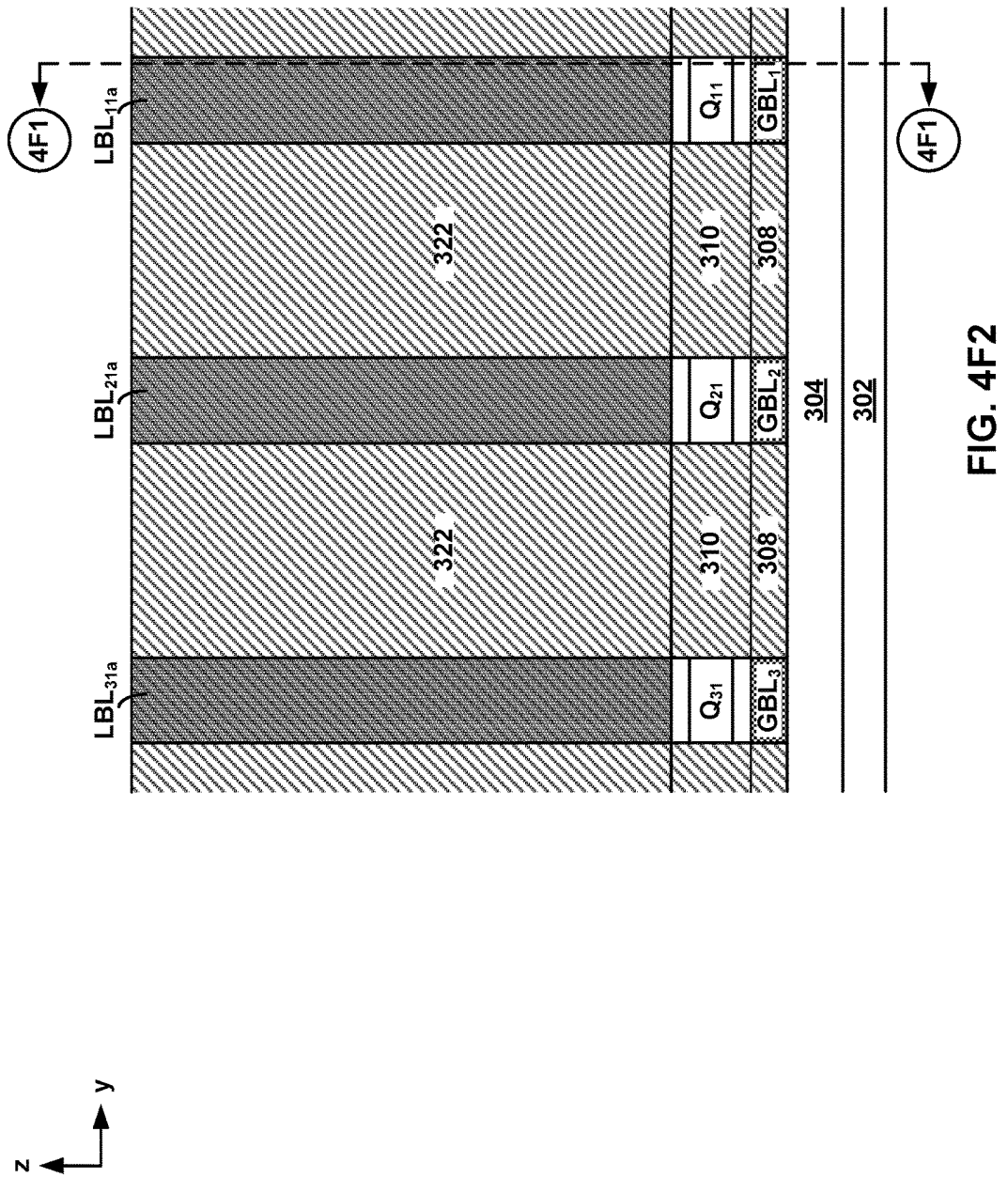
FIG. 4F2

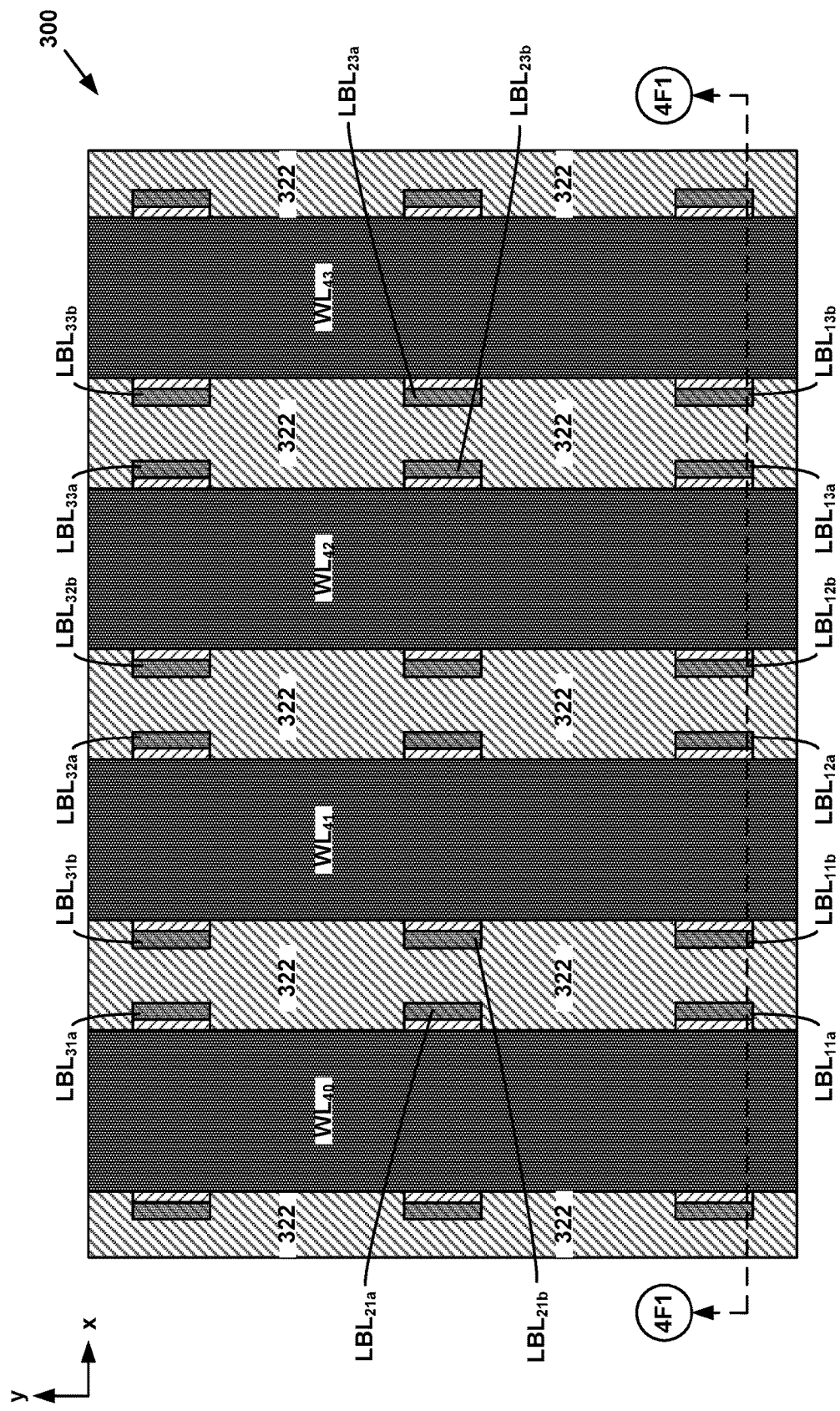
FIG. 4F3

METHODS AND APPARATUS FOR VERTICAL BIT LINE STRUCTURES IN THREE-DIMENSIONAL NONVOLATILE MEMORY

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to either a low resistance state or a high resistance state. The memory cells may be individually connected between first and second conductors (e.g., a bit line electrode and a word line electrode). The state of such a memory cell is typically changed by proper voltages being placed on the first and second conductors.

In recent years, non-volatile memory devices have been scaled to reduce the cost per bit. However, as process geometries shrink, many design and process challenges are presented

BRIEF DESCRIPTION OF THE DRAWINGS

FIGS. 2C1-2C3 depict an embodiment of a portion of a monolithic three-dimensional memory array.

FIGS. 3A-3E depict various views of an embodiment monolithic three-dimensional memory array.

FIGS. 4A1-4F3 are cross-sectional views of a portion of a substrate during an example fabrication of the monolithic three-dimensional memory array of FIGS. 3A-3E.

DETAILED DESCRIPTION

Figure 1A:
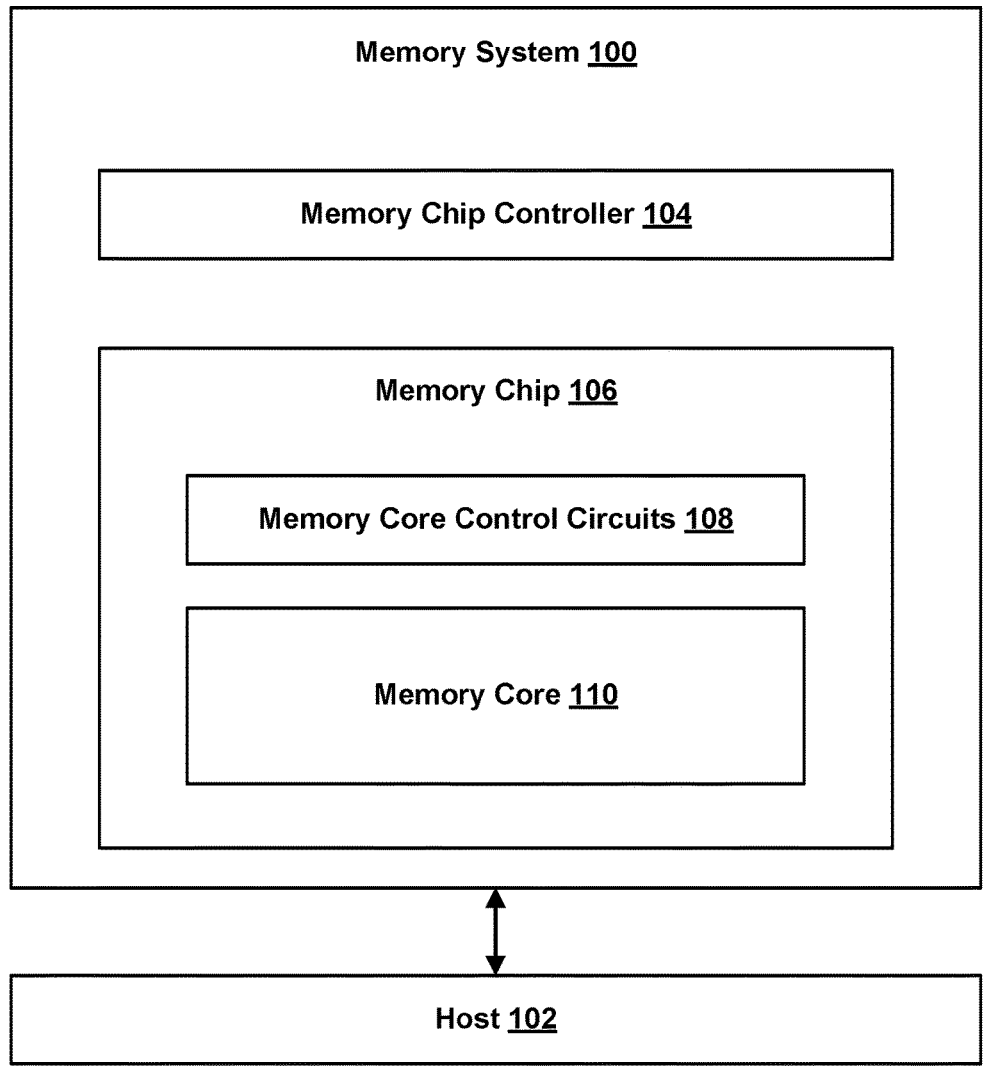
FIG. 1A depicts an embodiment of a memory system and a host.

Technology is described for forming vertical bit line structures in monolithic three-dimensional nonvolatile memory. An example method includes forming a vertical bit line disposed in a first direction above a substrate, forming a word line disposed in a second direction above the substrate, the second direction perpendicular to the first direction, forming a memory cell including a nonvolatile memory material at an intersection of the vertical bit line and the word line, forming a transistor above the substrate, and forming a bit line select device coupled between the vertical bit line and the transistor. The bit line select device may be a gated resistor (sometimes called a junctionless transistor).

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element, such as a phase change material, a ferroelectric material, or a metal oxide (e.g., hafnium oxide), disposed between first and second conductors. In some cases, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
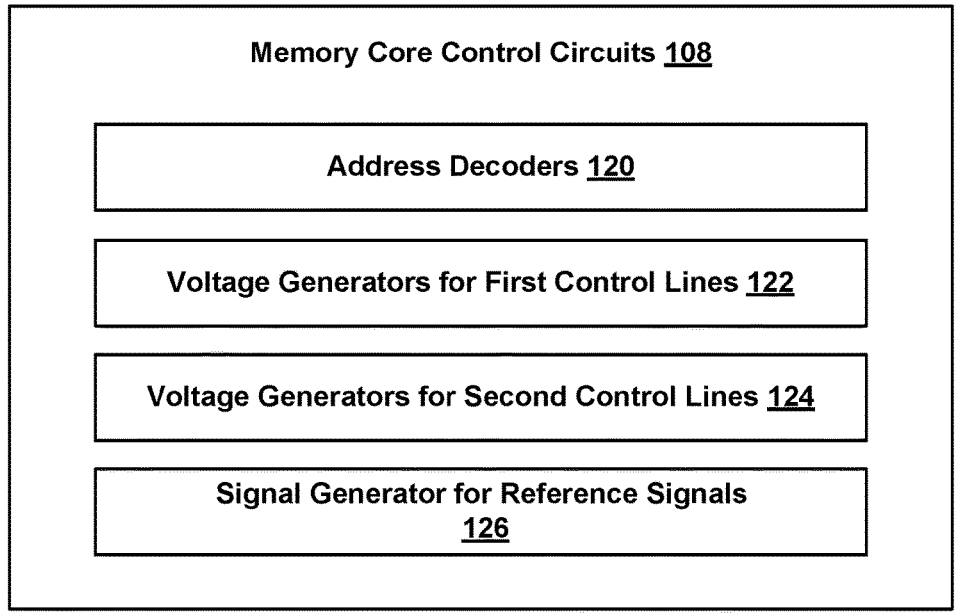
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
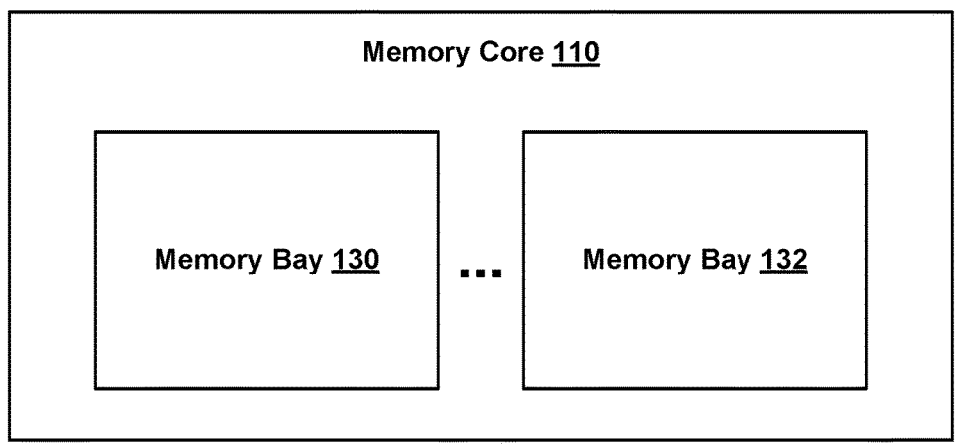
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
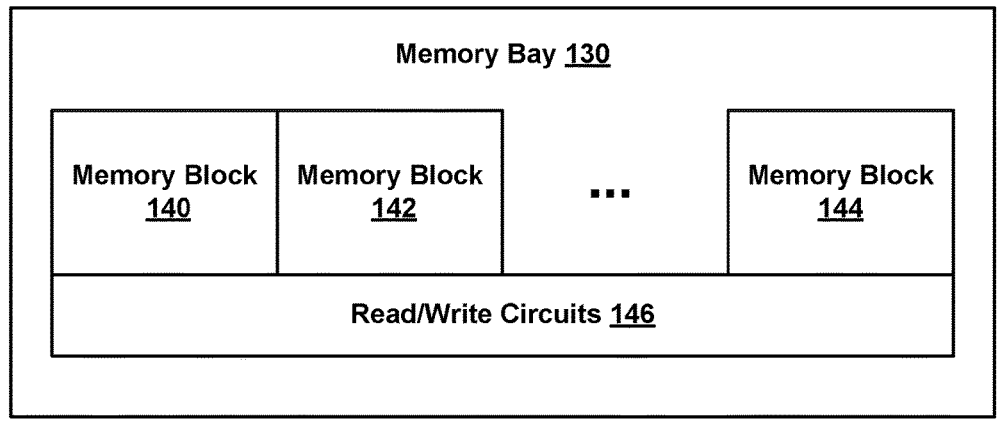
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
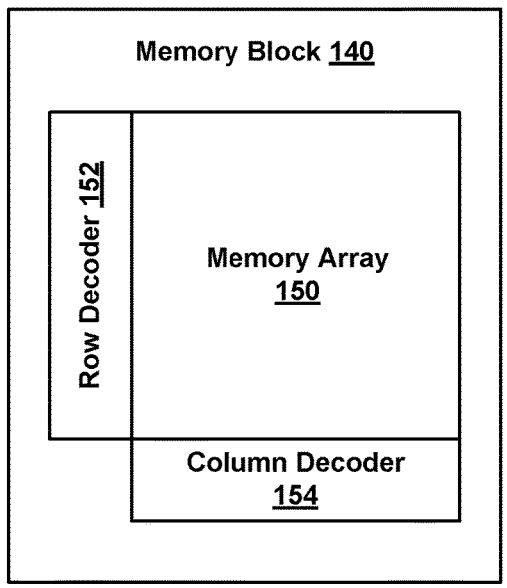
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
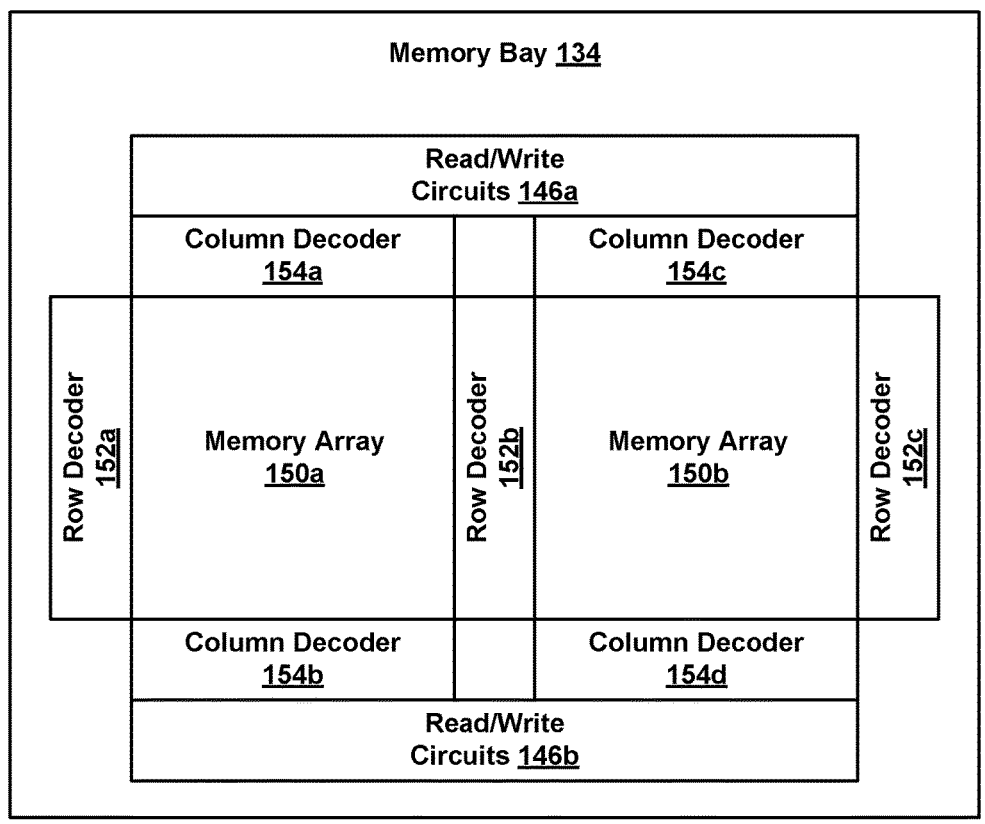
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
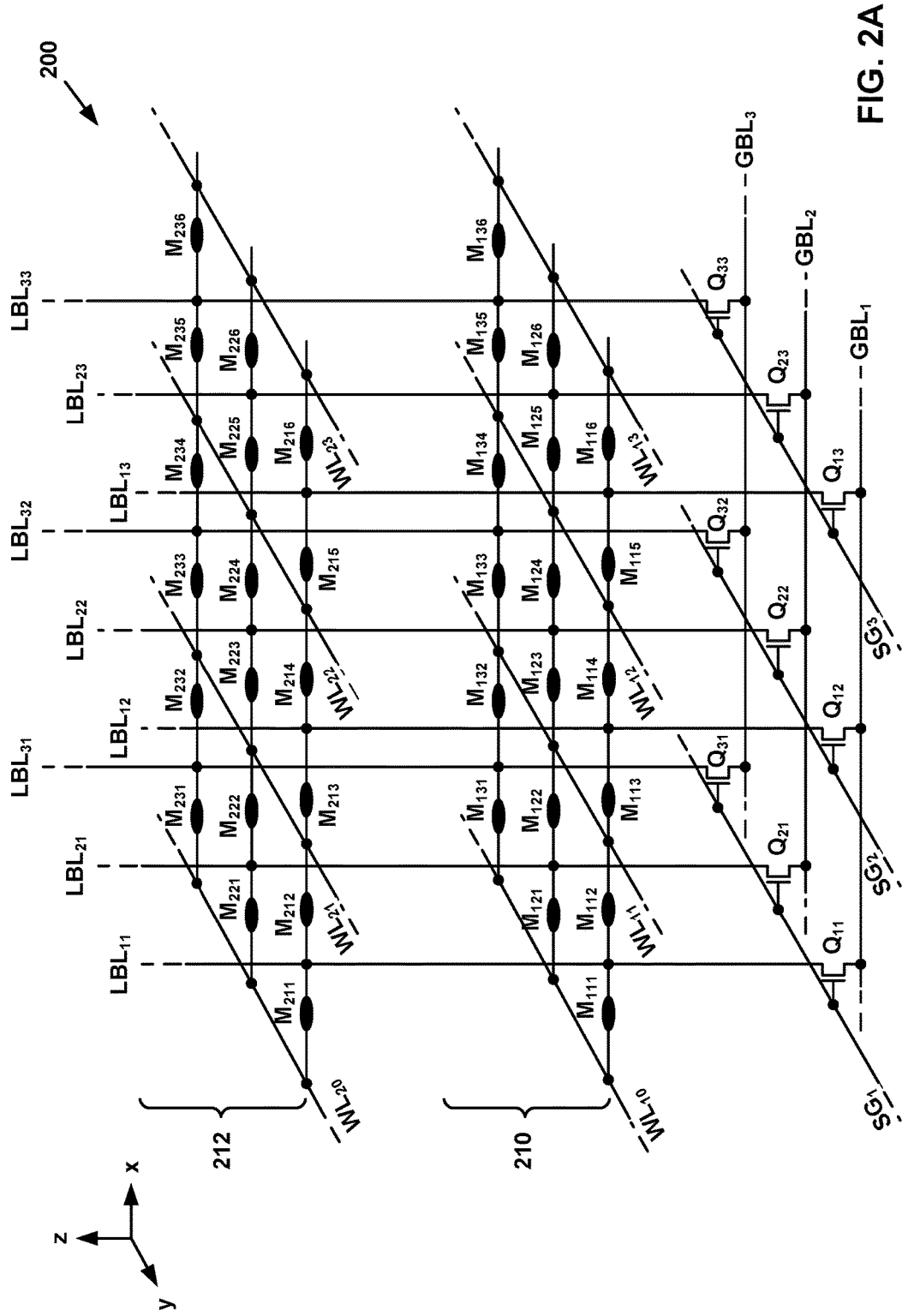
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be selectively applied to a corresponding local bit line. Therefore, when a first set of local bit lines (e.g., $LBL_{11}$-$LBL_{33}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as memory array 200, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

During the write operation described above, the word line (e.g., $WL_{20}$) connected to the selected memory cell ($M_{221}$) may be referred to as a "selected word line," and the local bit line (e.g., $LBL_{21}$) coupled to the selected memory cell ($M_{221}$) may be referred to as the "selected local bit line." All other word lines coupled to unselected memory cells may be referred to as "unselected word lines," and all other local bit lines coupled to unselected memory cells may be referred to as "unselected local bit lines." For example, if memory cell $M_{221}$ is the only selected memory cell in memory array 200, word lines $WL_{10}$-$WL_{13}$ and $WL_{21}$-$WL_{23}$ are unselected word lines, and local bit lines $LBL_{11}$, $LBL_{31}$, $LBL_{12}$-$LBL_{32}$, and $LBL_{13}$-$LBL_{33}$ are unselected local bit lines.

Memory cells coupled between an unselected word line and a selected local bit line may be referred to as "F cells," and memory cells coupled between a selected word line and an unselected bit line may be referred to as "H cells." Thus, in the example write operation described above, memory cells $M_{121}$, $M_{122}$ and $M_{222}$ are F cells, and memory cells $M_{211}$ and $M_{231}$ are H cells. Because no select device (e.g., a diode or transistor) is used to isolate unselected memory cells, F cells and H cells may contribute to significant leakage currents during memory operations.

Figure 2B:
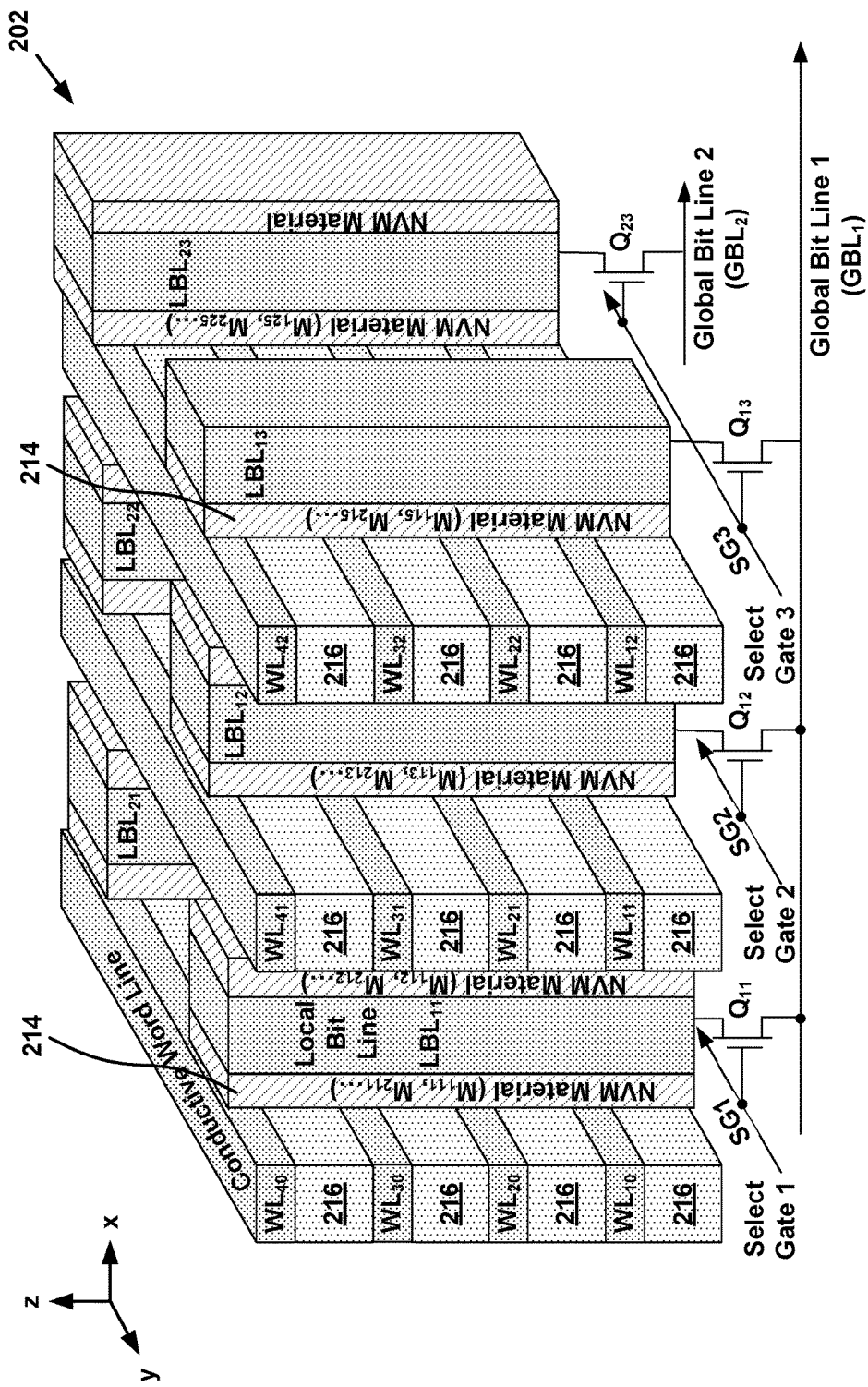
FIG. 2B depicts an embodiment of a portion of a monolithic three-dimensional memory array that includes vertical strips of a non-volatile memory material.
Figure 3A:
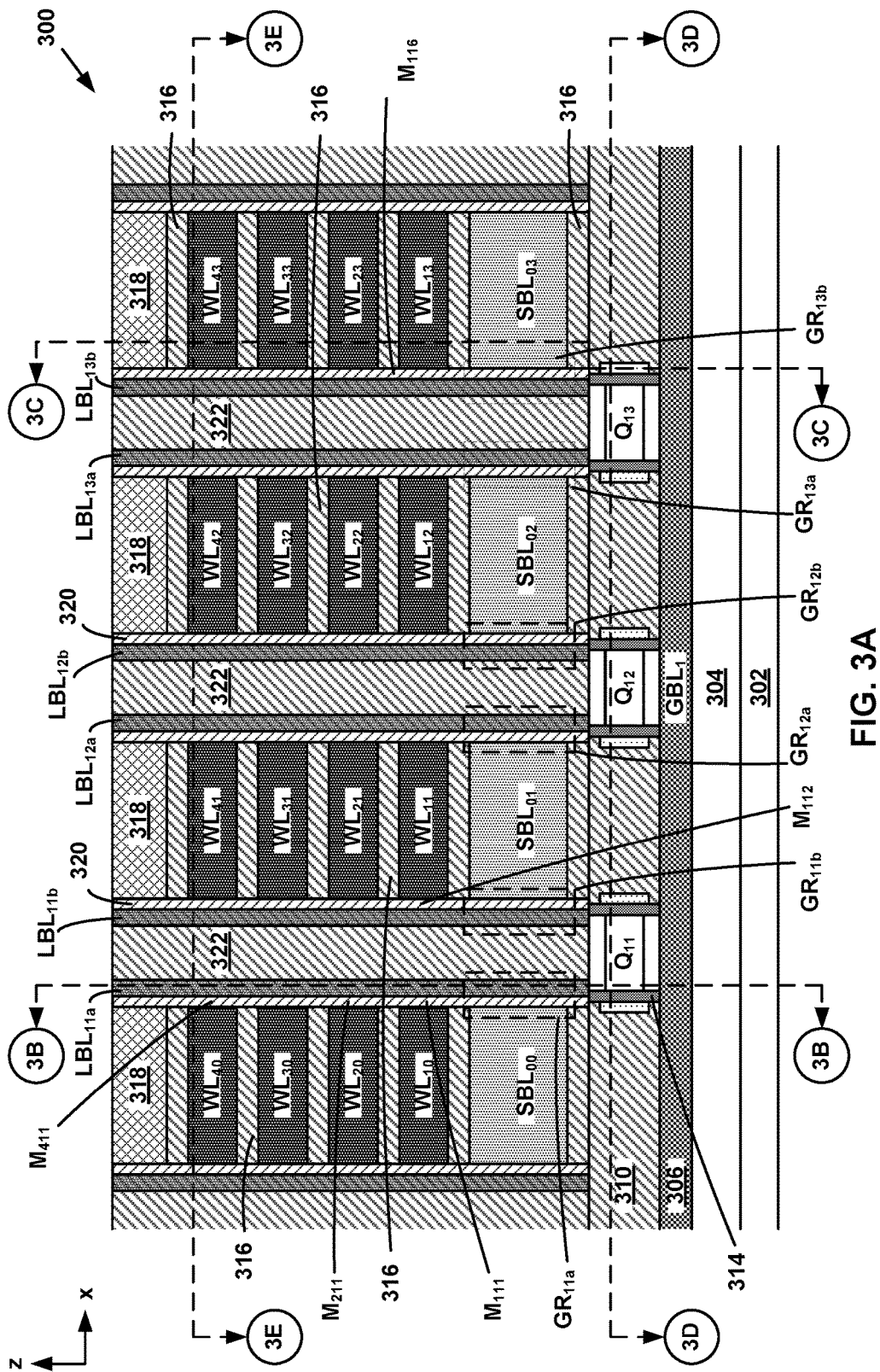
Figure 3C:
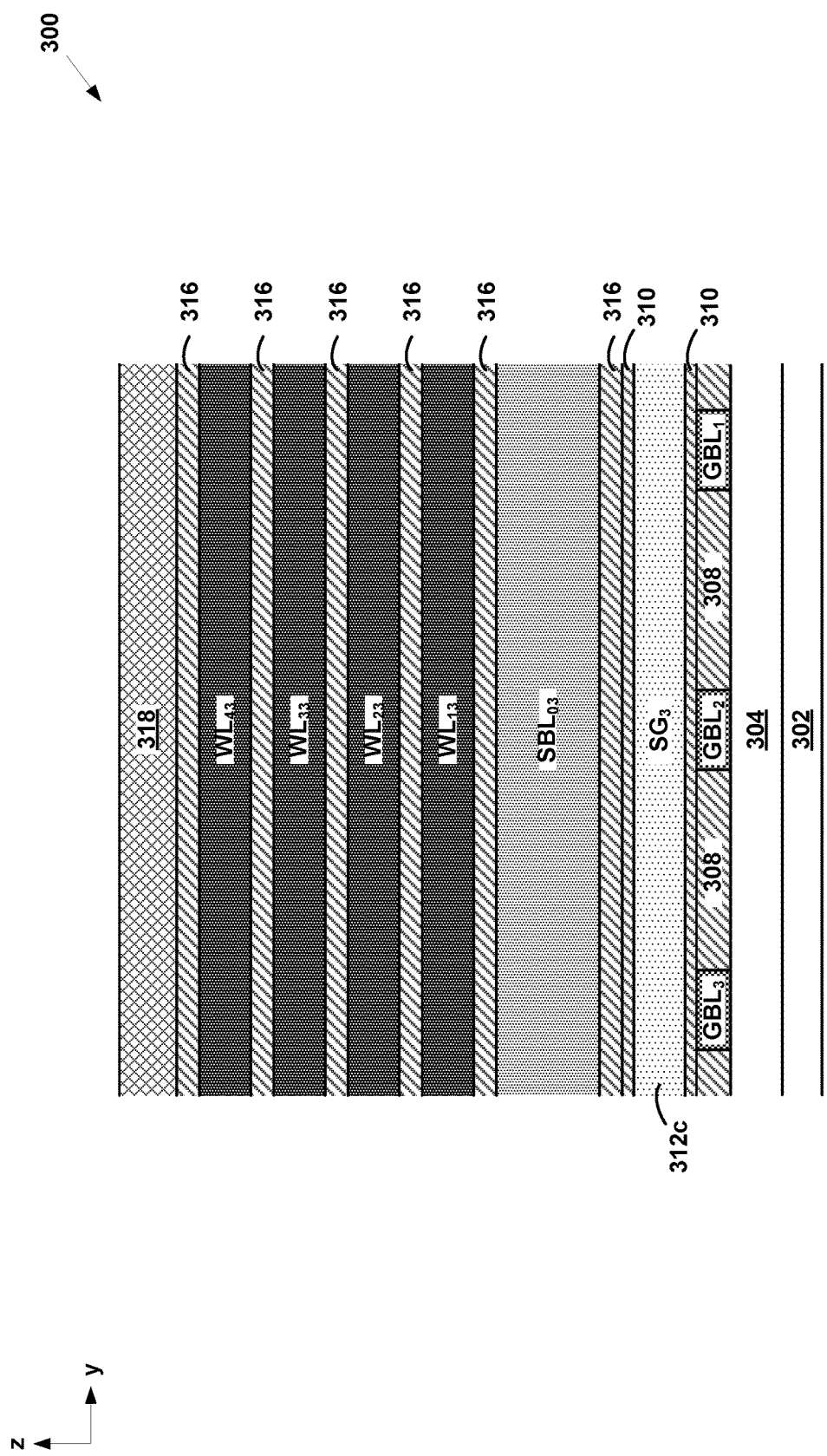
Figure 3D:
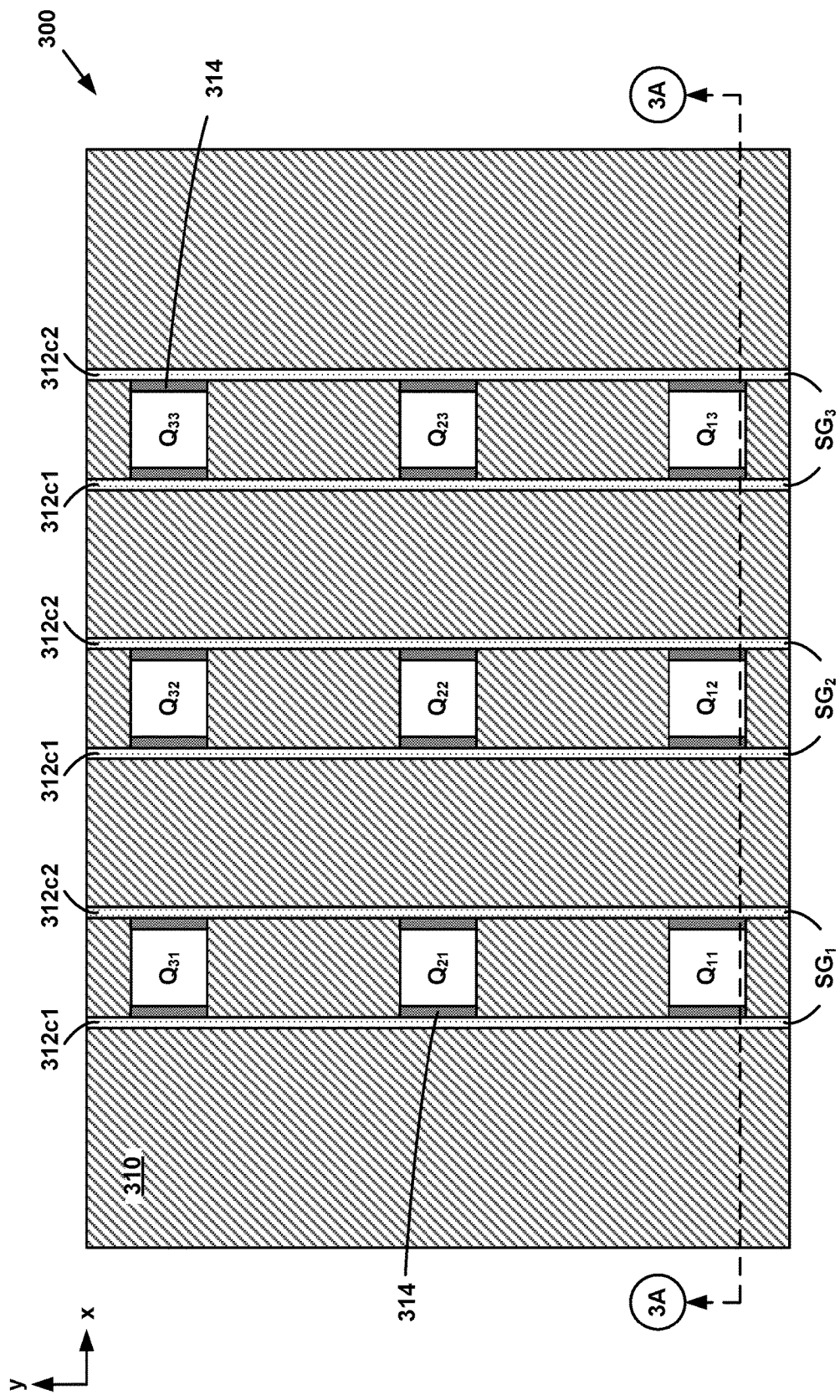
Figure 3E:
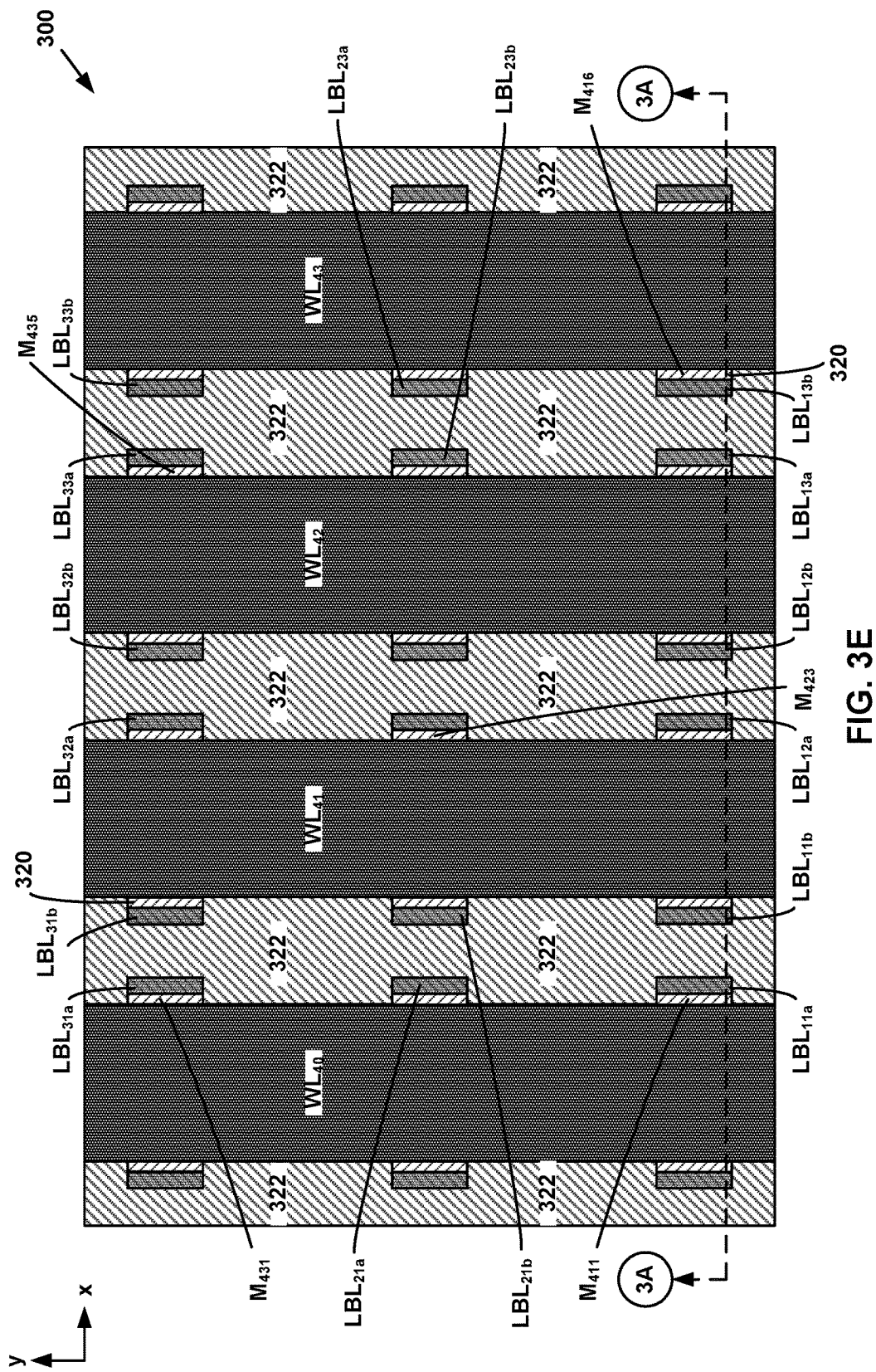

FIG. 2B depicts an embodiment of a portion of a monolithic three-dimensional memory array 202 that includes vertical strips of a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, ..., $WL_{42}$ that are formed in a first direction (e.g., an x-direction), vertical bit lines $LBL_{11}$, $LBL_{12}$, $LBL_{13}$, ..., $LBL_{23}$ that are formed in a second direction perpendicular to the first direction (e.g., a z-direction), and vertical strips of non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, ..., $WL_{42}$.

The vertical strip of the non-volatile memory material 214 may include, for example, a vertical oxide material, a vertical reversible resistance-switching memory material (e.g., a metal oxide layer such as nickel oxide, hafnium oxide, or other similar metal oxide material, a phase change material or other similar reversible resistance-switching memory material), or a vertical charge trapping material (e.g., a layer of silicon nitride). In an embodiment, the vertical strip of material 214 may include a single continuous layer of material that may be used by a plurality of memory cells or devices.

In an embodiment, portions of the vertical strip of the non-volatile memory material 214b may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LB_{12}$, $LBL_{13}$, . . . , $LBL_{23}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

As described above in connection with FIG. 2A, F cells and H cells may contribute to significant leakage currents during memory operations. Indeed, in memory array 200 of FIG. 2A, each local bit line $LBL_{11}$-$LBL_{33}$ is directly coupled to two memory cells on each memory level. For example, local bit line $LBL_{21}$ is directly coupled to memory cells $M_{121}$ and $M_{122}$ on first memory level 210, and is directly coupled to memory cells $M_{221}$ and $M_{222}$ on second memory level 212. In such a structure, the number of F cells is equal to (2×N−1), where N is the number of memory levels in the memory array. For example, if memory cell $M_{221}$ is a selected memory cell, three memory cells ($M_{121}$, $M_{122}$ and $M_{222}$) are F cells.

One technique to reduce the number of F cells (and therefore reduce leakage current) is to couple each local bit line to a single memory cell per memory level. Such a structure would double the number of local bit lines in memory array 200 of FIG. 2A. If each local bit line is coupled to a corresponding bit line select transistor (as in memory array 200), doubling the number of local bit lines would double the number of bit line select transistors, and the size of the memory array would substantially increase. Such an increase would undesirably add cost and complexity.

As an alternative, technology is described for reducing the number of F cells by coupling each local bit line to a single memory cell per memory level, and by coupling each bit line select transistor to more than one local bit line. In an embodiment, each bit line select transistor is associated with and coupled to a corresponding two local bit lines. In other embodiments, each bit line select transistor may be associated with and coupled to more than two local bit lines.

FIGS. 2C1-2C3 depict an embodiment of a portion of a monolithic three-dimensional memory array 204 in which each local bit line is coupled to a single memory cell per memory level, and each bit line select transistor is associated with and coupled to a corresponding two local bit lines. In particular, monolithic three-dimensional memory array 204 includes a first memory level 218, and a second memory level 220 positioned above first memory level 218. Memory array 204 is one example of an implementation for memory array 150 of FIG. 1E. Local bit lines $LBL_{11a}$-$LBL_{33b}$ are arranged in a first direction (e.g., a vertical or z-direction) and word lines $WL_{10}$-$WL_{13}$ and $WL_{20}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

Each local bit line $LBL_{11a}$-$LBL_{33b}$ is coupled to a single memory cell per memory level. For example, memory cell $M_{111}$ is coupled between local bit line $LBL_{11a}$ and word line $WL_{10}$ on first memory level 218, and memory cell $M_{234}$ is coupled between local bit line $LBL_{32b}$ and word line $WL_{22}$ one second memory level 220. The particular memory cell may include a floating gate memory element, a charge trap memory element (e.g., using a silicon nitride material), a reversible resistance-switching memory element, or other similar device.

Global bit lines $GBL_1$-$GBL_3$ are arranged in a third direction (e.g., a y-direction) that is perpendicular to both the first direction and the second direction.

Each bit line select transistor is associated with and coupled to a corresponding two local bit lines. For example, bit line select transistor $Q_{11S}$ is associated with and coupled to local bit lines $LBL_{11a}$ and $LBL_{11b}$, bit line select transistor $Q_{12S}$ is associated with and coupled to local bit lines $LBL_{12a}$ and $LBL_{12b}$, and bit line select transistor $Q_{13S}$ is associated with and coupled to local bit lines $LBL_{33a}$ and $LBL_{13b}$. Likewise, bit line select transistor $Q_{21S}$ is associated with and coupled to local bit lines $LBL_{21a}$ and $LBL_{21b}$, bit line select transistor $Q_{22S}$ is associated with and coupled to local bit lines $LBL_{22a}$ and $LBL_{22b}$, and bit line select transistor $Q_{23S}$ is associated with and coupled to local bit lines $LBL_{23a}$ and $LBL_{23b}$. Bit line select transistors $Q_{11S}$-$Q_{33S}$ may be field effect transistors, such as shown, or may be any other transistors.

To provide isolation between the two local bit lines that are associated with and coupled to a bit line select transistor, a bit line select device is disposed between each local bit line and the associated bit line select transistor. For example, bit line select device $GR_{11a}$ is disposed between local bit line $LBL_{11a}$ and associated bit line select transistor $Q_{11S}$, and bit line select device $GR_{11b}$ is disposed between local bit line $LBL_{11b}$ and associated bit line select transistor $Q_{11S}$. Similarly, bit line select device $GR_{21a}$ is disposed between local bit line $LBL_{21a}$ and associated bit line select transistor $Q_{21S}$, and bit line select device $GR_{21b}$ is disposed between local bit line $LBL_{21b}$ and associated bit line select transistor $Q_{21S}$. Likewise, bit line select device $GR_{33a}$ is disposed between local bit line $LBL_{33a}$ and associated bit line select transistor $Q_{33S}$, and bit line select device $GR_{33b}$ is disposed between local bit line $LBL_{33b}$ and associated bit line select transistor $Q_{33S}$. Bit line select devices $GR_{11a}$-$GR_{33b}$ may be gated resistors (sometimes called junctionless transistors), such as shown, or may be other select devices.

Disposing a bit line select device $GR_{11a}$-$GR_{33b}$ between corresponding local bit lines $LBL_{11a}$-$LBL_{33b}$, respectively, and associated bit line select transistors $Q_{11S}$-$Q_{33S}$, respectively, a channel length of bit line select transistors $Q_{11S}$-$Q_{33S}$ may be reduced (i.e., the vertical height of bit line select transistors $Q_{11S}$-$Q_{33S}$ may be reduced) to increase the drive current of bit line select transistors $Q_{11S}$-$Q_{33S}$. Although such a channel length reduction may reduce the breakdown voltage of bit line select transistors $Q_{11S}$-$Q_{33S}$, the presence of bit line select device $GR_{11a}$-$GR_{33b}$ effectively in series with bit line select transistors $Q_{11S}$-$Q_{33S}$ may enable the overall circuit structure to meet breakdown voltage requirements.

Each of bit line select devices $GR_{11a}$-$GR_{31a}$ has a first terminal coupled to a corresponding local bit line $LBL_{11a}$-$LBL_{31a}$, respectively, a second terminal (e.g., a control terminal) coupled to bit line select line $SBL_{00}$, and a third terminal coupled at nodes $N_{11}$-$N_{31}$, respectively, to a corresponding first terminal (e.g., a drain/source terminal) of associated bit line select transistors $Q_{11S}$-$Q_{31S}$, respectively. When bit line select line $SBL_{00}$ has a first voltage (e.g., LOW), each of bit line select devices $GR_{11a}$-$GR_{31a}$ has a first (e.g., HIGH) impedance, substantially no current may flow through bit line select devices $GR_{11a}$-$GR_{31a}$, and local bit lines $LBL_{11a}$-$LBL_{31a}$ are substantially disconnected from associated bit line select transistors $Q_{11S}$-$Q_{31S}$, respectively. When bit line select line $SBL_{00}$ has a second voltage (e.g., HIGH), each of bit line select devices $GR_{11a}$-$GR_{31a}$ has a second (e.g., LOW) impedance, current may flow through bit line select devices $GR_{11a}$-$GR_{31a}$, and local bit lines $LBL_{11a}$-$LBL_{31a}$ are connected to associated bit line select transistors $Q_{11S}$-$Q_{31S}$, respectively.

Each of bit line select devices $GR_{11b}$-$GR_{31b}$ has a first terminal coupled to a corresponding local bit line $LBL_{11b}$-$LBL_{31b}$, respectively, a second terminal (e.g., a control terminal) coupled to bit line select line $SBL_{01}$, and a third terminal coupled at nodes $N_{11}$-$N_{31}$, respectively, to the first terminal of associated bit line select transistors $Q_{11S}$-$Q_{31S}$, respectively. When bit line select line $SBL_{01}$ has a first voltage (e.g., LOW), each of bit line select devices $GR_{11b}$-$GR_{31b}$ has a first (e.g., HIGH) impedance, substantially no current may flow through bit line select devices $GR_{11b}$-$GR_{31b}$, and local bit lines $LBL_{11b}$-$LBL_{31b}$ are substantially disconnected from associated bit line select transistors $Q_{11S}$-$Q_{31S}$, respectively. When bit line select line $SBL_{01}$ has a second voltage (e.g., HIGH), each of bit line select devices $GR_{11b}$-$GR_{31b}$ has a second (e.g., LOW) impedance, current may flow through bit line select devices $GR_{11b}$-$GR_{31b}$, and local bit lines $LBL_{11b}$-$LBL_{31b}$ are connected to associated bit line select transistors $Q_{11S}$-$Q_{31S}$, respectively.

Each of bit line select devices $GR_{12a}$-$GR_{32a}$ has a first terminal coupled to a corresponding local bit line $LBL_{12a}$-$LBL_{32a}$, respectively, a second terminal (e.g., a control terminal) coupled to bit line select line $SBL_{01}$, and a third terminal coupled at nodes $N_{12}$-$N_{32}$, respectively, to a corresponding first terminal (e.g., a drain/source terminal) of associated bit line select transistors $Q_{12S}$-$Q_{32S}$, respectively. When bit line select line $SBL_{01}$ has a first voltage (e.g., LOW), each of bit line select devices $GR_{12a}$-$GR_{32a}$ has a first (e.g., HIGH) impedance, substantially no current may flow through bit line select devices $GR_{12a}$-$GR_{32a}$, and local bit lines $LBL_{12a}$-$LBL_{32a}$ are substantially disconnected from associated bit line select transistors $Q_{12S}$-$Q_{32S}$, respectively. When bit line select line $SBL_{01}$ has a second voltage (e.g., HIGH), each of bit line select devices $GR_{12a}$-$GR_{32a}$ has a second (e.g., LOW) impedance, current may flow through bit line select devices $GR_{12a}$-$GR_{32a}$, and local bit lines $LBL_{12a}$-$LBL_{32a}$ are connected to associated bit line select transistors $Q_{12S}$-$Q_{32S}$, respectively.

Each of bit line select devices $GR_{12b}$-$GR_{32b}$ has a first terminal coupled to a corresponding local bit line $LBL_{12b}$-$LBL_{32b}$, respectively, a second terminal (e.g., a control terminal) coupled to bit line select line $SBL_{02}$, and a third terminal coupled at nodes $N_{12}$-$N_{32}$, respectively, to the first terminal of associated bit line select transistors $Q_{12S}$-$Q_{32S}$, respectively. When bit line select line $SBL_{02}$ has a first voltage (e.g., LOW), each of bit line select devices $GR_{12b}$-$GR_{32b}$ has a first (e.g., HIGH) impedance, substantially no current may flow through bit line select devices $GR_{12b}$-$GR_{32b}$, and local bit lines $LBL_{12b}$-$LBL_{32b}$ are substantially disconnected from associated bit line select transistors $Q_{12S}$-$Q_{32S}$, respectively. When bit line select line $SBL_{02}$ has a second voltage (e.g., HIGH), each of bit line select devices $GR_{12b}$-$GR_{32b}$ has a second (e.g., LOW) impedance, current may flow through bit line select devices $GR_{12b}$-$GR_{32b}$, and local bit lines $LBL_{12b}$-$LBL_{32b}$ are connected to associated bit line select transistors $Q_{12S}$-$Q_{32S}$, respectively.

Each of bit line select devices $GR_{13a}$-$GR_{33a}$ has a first terminal coupled to a corresponding local bit line $LBL_{13a}$-$LBL_{33a}$, respectively, a second terminal (e.g., a control terminal) coupled to bit line select line $SBL_{02}$, and a third terminal coupled at nodes $N_{13}$-$N_{33}$, respectively, to a corresponding first terminal (e.g., a drain/source terminal) of associated bit line select transistors $Q_{13S}$-$Q_{33S}$, respectively. When bit line select line $SBL_{02}$ has a first voltage (e.g., LOW), each of bit line select devices $GR_{13a}$-$GR_{33a}$ has a first (e.g., HIGH) impedance, substantially no current may flow through bit line select devices $GR_{13a}$-$GR_{33a}$, and local bit lines $LB_{13a}$-$LBL_{33a}$ are substantially disconnected from associated bit line select transistors $Q_{13S}$-$Q_{33S}$, respectively. When bit line select line $SBL_{02}$ has a second voltage (e.g., HIGH), each of bit line select devices $GR_{13a}$-$GR_{33a}$ has a second (e.g., LOW) impedance, current may flow through bit line select devices $GR_{13a}$-$GR_{33a}$, and local bit lines $LBL_{13a}$-$LBL_{33a}$ are connected to associated bit line select transistors $Q_{13S}$-$Q_{33S}$, respectively.

Each of bit line select devices $GR_{13b}$-$GR_{33b}$ has a first terminal coupled to a corresponding local bit line $LBL_{13b}$-$LBL_{33b}$, respectively, a second terminal (e.g., a control terminal) coupled to bit line select line $SBL_{03}$, and a third terminal coupled at nodes $N_{13}$-$N_{33}$, respectively, to the first terminal of associated bit line select transistors $Q_{13S}$-$Q_{33S}$, respectively. When bit line select line $SBL_{03}$ has a first voltage (e.g., LOW), each of bit line select devices $GR_{13b}$-$GR_{33b}$ has a first (e.g., HIGH) impedance, substantially no current may flow through bit line select devices $GR_{13b}$-$GR_{33b}$, and local bit lines $LBL_{13b}$-$LBL_{33b}$ are substantially disconnected from associated bit line select transistors $Q_{13S}$-$Q_{33S}$, respectively. When bit line select line $SBL_{03}$ has a second voltage (e.g., HIGH), each of bit line select devices $GR_{13b}$-$GR_{33b}$ has a second (e.g., LOW) impedance, current may flow through bit line select devices $GR_{13b}$-$GR_{33b}$, and local bit lines $LBL_{13b}$-$LBL_{33b}$ are connected to associated bit line select transistors $Q_{13S}$-$Q_{33S}$, respectively.

Each of bit line select transistors $Q_{11S}$-$Q_{31S}$ has a first terminal (e.g., a drain/source terminal) coupled to a corresponding node $N_{11}$-$N_{31}$, respectively, a second terminal (e.g., a source/drain terminal) coupled to global bit lines $GBL_1$-$GBL_3$, respectively, and a third terminal (e.g., a gate terminal) coupled to row select line $SG_1$. Bit line select devices $GR_{11a}$-$GR_{31a}$ and bit line select transistorsr $Q_{11S}$-$Q_{31S}$, respectively, are associated with local bit lines $LBL_{11a}$-$LBL_{31a}$, respectively, and may be used to connect/disconnect local bit lines $LBL_{11a}$-$LBL_{31a}$ to/from global bit lines $GBL_1$-$GBL_3$, respectively, using bit line select line $SBL_{00}$ and row select line $SG_1$. Bit line select devices $GR_{11b}$-$GR_{31b}$ and bit line select transistorsr $Q_{11S}$-$Q_{31S}$, respectively, are associated with local bit lines $LBL_{11b}$-$LBL_{31b}$, respectively, and may be used to connect/disconnect local bit lines $LBL_{11b}$-$LBL_{31b}$ to/from global bit lines $GBL_1$-$GBL_3$, respectively, using bit line select line $SBL_{01}$ and row select line $SG_1$.

Each of bit line select transistors $Q_{12S}$-$Q_{32}S$ has a first terminal (e.g., a drain/source terminal) coupled to a corresponding node $N_{12}$-$N_{32}$, respectively, a second terminal (e.g., a source/drain terminal) coupled to global bit lines $GBL_1$-$GBL_3$, respectively, and a third terminal (e.g., a gate terminal) coupled to row select line $SG_2$. Bit line select devices $GR_{12a}$-$GR_{32a}$ and bit line select transistorsr $Q_{12S}$-$Q_{32}S$, respectively, are associated with local bit lines $LBL_{12a}$-$LBL_{32a}$, respectively, and may be used to connect/disconnect local bit lines $LBL_{12a}$-$LBL_{32a}$ to/from global bit lines $GBL_1$-$GBL_3$, respectively, using bit line select line $SBL_{01}$ and row select line $SG_2$. Bit line select devices $GR_{12b}$-$GR_{32b}$ and bit line select transistorsr $Q_{12S}$-$Q_{32}S$, respectively, are associated with local bit lines $LBL_{12b}$-$LBL_{32b}$, respectively, and may be used to connect/disconnect local bit lines $LBL_{12b}$-$LBL_{32b}$ to/from global bit lines $GBL_1$-$GBL_3$, respectively, using bit line select line $SBL_{02}$ and row select line $SG_2$.

Each of bit line select transistors $Q_{13S}$-$Q_{33S}$ has a first terminal (e.g., a drain/source terminal) coupled to a corresponding node $N_{13}$-$N_{33}$, respectively, a second terminal (e.g., a source/drain terminal) coupled to global bit lines $GBL_1$-$GBL_3$, respectively, and a third terminal (e.g., a gate terminal) coupled to row select line $SG_3$. Bit line select devices $GR_{13a}$-$GR_{33a}$ and bit line select transistorsr $Q_{13S}$-$Q_{33S}$, respectively, are associated with local bit lines $LBL_{13a}$-$LBL_{33a}$, respectively, and may be used to connect/disconnect local bit lines $LBL_{13a}$-$LBL_{33a}$ to/from global bit lines $GBL_1$-$GBL_3$, respectively, using bit line select line $SBL_{02}$ and row select line $SG_3$. Bit line select devices $GR_{13b}$-$GR_{33b}$ and bit line select transistorsr $Q_{13S}$-$Q_{33S}$, respectively, are associated with local bit lines $LBL_{13b}$-$LBL_{33b}$, respectively, and may be used to connect/disconnect local bit lines $LBL_{13b}$-$LBL_{33b}$ to/from global bit lines $GBL_1$-$GBL_3$, respectively, using bit line select line $SBL_{03}$ and row select line $SG_3$.

Because a bit line select device and a bit line select transistor are associated with a corresponding local bit line, the voltage of a particular global bit line may be applied to a corresponding local bit line. Therefore, when a first set of local bit lines (e.g., $LBL_{11a}$-$LBL_{31a}$) is biased to global bit lines $GBL_1$-$GBL_3$, the other local bit lines (e.g., $LBL_{11b}$-$LBL_{33b}$, $LBL_{12a}$-$LBL_{32a}$, $LBL_{32b}$-$LBL_{32b}$, $LBL_{13a}$-$LBL_{33a}$, and $LBL_{13b}$-$LBL_{33b}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines (e.g., $LBL_{11a}$-$LBL_{31a}$) is biased to one or more selected bit line voltages via the global bit lines $GBL_1$-$GBL_3$, while the other local bit lines (e.g., $LBL_{11b}$-$LBL_{31b}$, $LBL_{12a}$-$LBL_{32a}$, $LBL_{12b}$-$LBL_{32b}$, $LBL_{13a}$-$LBL_{33a}$, and $LBL_{13b}$-$LBL_{33b}$) are floated. The one or more selected bit line voltages may correspond with, for example, one or more read voltages during a read operation or one or more programming voltages during a programming operation.

In an embodiment, a vertical bit line memory array, such as memory array 204, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11a}$) coupled to the selected memory cell ($M_{111}$) is biased to a selected bit line voltage in read mode (e.g., 1 V) via the associated bit line select device $GR_{11a}$ and associated bit line select transistor (e.g., $Q_{11S}$) coupled to the selected local bit line ($LBL_{11a}$), and the global bit line (e.g., $GBL_1$) coupled to associated bit line select transistor ($Q_{11S}$). A sense amplifier may then be coupled to the selected local bit line ($LBL_{11a}$) to determine a read current $I_{READ}$ of the selected memory cell ($M_{111}$). The read current $I_{READ}$ is conducted by the associated bit line select device $GR_{11a}$ and shared bit line select transistor $Q_{11S}$, and may be between about 100 nA and about 500 nA, although other read currents may be used.

In an embodiment of a write operation, data may be written to a selected memory cell (e.g., memory cell $M_{224}$) by biasing the word line connected to the selected memory cell (e.g., $WL_{22}$) to a selected word line voltage in write mode (e.g., 5V). The local bit line (e.g., $LBL_{22b}$) coupled to the selected memory cell ($M_{224}$) is biased to a selected bit line voltage in write mode (e.g., 0 V) via the associated bit line select device $GR_{22b}$ and bit line select transistor (e.g., $Q_{22S}$) coupled to the selected local bit line ($LBL_{22b}$), and the global bit line (e.g., $GBL_2$) coupled to bit line select transistor ($Q_{22S}$). During a write operation, a programming current $I_{PGRM}$ is conducted by the associated bit line select device $GR_{22b}$ and bit line select transistor $Q_{22S}$, and may be between about 3 uA and about 6 uA, although other programming currents may be used.

FIGS. 3A-3E depict various views of an embodiment of a portion of a monolithic three-dimensional memory array 300 that includes vertical strips of a non-volatile memory material. The physical structure depicted in FIGS. 3A-3E may include one implementation for a portion of the monolithic three-dimensional memory array depicted in FIGS. 2C1-2C3.

Monolithic three-dimensional memory array 300 includes vertical bit lines $LBL_{11a}$-$LBL_{33b}$ arranged in a first direction (e.g., a z-direction), word lines $WL_{10}$, $WL_{44}$, . . . , $WL_{43}$ arranged in a second direction (e.g., an x-direction) perpendicular to the first direction, bit line select lines $SBL_{01}$, $SBL_{02}$, $SBL_{03}$ and row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions.

Vertical bit lines $LBL_{11a}$-$LBL_{33b}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 300 may include more or fewer than twenty-four word lines, three row select lines, three global bit lines, and eighteen vertical bit lines.

In an embodiment, global bit lines $GBL_1$, $GBL_2$, $GBL_3$ are disposed above a substrate 302, such as a silicon, germanium, silicon-germanium, undoped, doped, bulk, silicon-on-insulator ("SOI") or other substrate with or without additional circuitry. In an embodiment, an isolation layer 304, such as a layer of silicon dioxide, silicon nitride, silicon oxynitride or any other suitable insulating layer, is formed above substrate 302.

In an embodiment, a first dielectric material layer 308 (e.g., silicon dioxide) and a second dielectric material layer 310 (e.g., silicon dioxide) are formed above isolation layer 304. Global bit lines $GBL_1$, $GBL_2$, $GBL_3$ are disposed above isolation layer 304 and are separated from one another by first dielectric material layer 308.

Vertically-oriented bit line select transistors $Q_{11}$-$Q_{33}$ are disposed above global bit lines $GBL_1$, $GBL_2$, $GBL_3$ and are separated from one another by second dielectric material layer 310. Vertically-oriented bit line select transistors $Q_{11}$-$Q_{13}$ are disposed above and electrically coupled to global bit line $GBL_1$, vertically-oriented bit line select transistors $Q_{21}$-$Q_{23}$ are disposed above and electrically coupled to global bit line $GBL_2$, and vertically-oriented bit line select transistors $Q_{31}$-$Q_{33}$ are disposed above and electrically coupled to global bit line $GBL_3$. Vertically-oriented bit line select transistors $Q_{11}$-$Q_{33}$ may be field effect transistors, although other transistors types may be used. In an embodiment, each of vertically-oriented bit line select transistors $Q_{31}$-$Q_{33}$ has a height between about 100 angstroms and about 4000 angstroms. Other height values may be used.

Each of vertically-oriented bit line select transistors $Q_{11}$-$Q_{33}$ has a first terminal 312a (e.g., a drain/source terminal), a second terminal 312b (e.g., a source/drain terminal), a first control terminal 312c1 (e.g., a first gate terminal) and a second control terminal 312c2 (e.g., a second gate terminal). First gate terminal 312c1 and second gate terminal 312c2 may be disposed on opposite sides of the vertically-oriented bit line select transistor. A gate dielectric material 314 (e.g., $SiO_2$) is disposed between first gate terminal 312c1 and first terminal 312a and second terminal 312b, and also is disposed between second gate terminal 312c2 and first terminal 312a and second terminal 312b.

First gate terminal 312c1 may be used to selectively induce a first conductive channel between first terminal 312a and second terminal 312b of the transistor, and second gate terminal 312c2 may be used to selectively induce a second conductive channel between first terminal 312a and second terminal 312b of the transistor. In an embodiment, first gate terminal 312c1 and second gate terminal 312c2 are coupled together to form a single control terminal 312c that may be used to collectively turn ON and OFF the vertically-oriented bit line select transistor.

Row select lines $SG_1$, $SG_2$, $SG_3$ are disposed above global bit lines $GBL_1$, $GBL_2$ and $GBL_3$, and form gate terminals 312c of vertically-oriented bit line select transistors $Q_{11}$-$Q_{33}$. In particular, row select line $SG_1$ forms the gate terminals of vertically-oriented bit line select transistors $Q_{11}$, $Q_{21}$ and $Q_{31}$, row select line $SG_2$ forms the gate terminals of vertically-oriented bit line select transistors $Q_{12}$, $Q_{22}$ and $Q_{32}$, and row select line $SG_3$ forms the gate terminals of vertically-oriented bit line select transistors $Q_{13}$, $Q_{23}$ and $Q_{33}$.

A stack of word lines $WL_{10}$, $WL_{11}$, ..., $WL_{43}$ is disposed above vertically-oriented bit line select transistors $Q_{11}$-$Q_{33}$, with a third dielectric material layer 316 (e.g., silicon dioxide) separating adjacent word lines. In an embodiment, the first (lowest) word line layer of the stack of word lines may be dummy word lines used as bit line select lines $SBL_{01}$, $SBL_{02}$, $SBL_{03}$. An etch stop layer 318 (e.g., SiN) may be formed above the stack of word lines $WL_{10}$, $WL_{11}$, ..., $WL_{43}$.

In an embodiment, vertical strips of a non-volatile memory material 320 are disposed adjacent bit line select lines $SBL_{01}$, $SBL_{02}$, $SBL_{03}$ and word lines $WL_{10}$, $WL_{11}$, ..., $WL_{43}$. Vertical strips of non-volatile memory material 320 may be formed in the first direction (e.g., the z-direction). A vertical strip of non-volatile memory material 320 may include, for example, a vertical oxide layer, a vertical reversible resistance-switching material (e.g., a metal oxide layer such as nickel oxide, hafnium oxide, or other similar metal oxide material, a phase change material or other similar reversible resistance-switching material), a vertical charge trapping layer (e.g., a layer of silicon nitride), or other non-volatile memory material. A vertical strip of non-volatile memory material 320 may include a single continuous layer of material that may be used by a plurality of memory cells or devices. For simplicity, vertical strip of non-volatile memory material 320 will be referred to in the remaining discussion as reversible resistance-switching memory material 320.

Vertical bit lines $LBL_{11a}$-$LBL_{33b}$ are disposed adjacent reversible resistance-switching memory material 320, are formed of a conductive material (e.g., a highly doped polysilicon material) and are separated from one another by a fourth dielectric material layer 322 (e.g., silicon dioxide). Vertical bit lines $LBL_{11a}$-$LBL_{33b}$ also may include an adhesion layer (e.g., titanium nitride) (not shown) disposed on an outer surface of each vertical bit line $LBL_{11a}$-$LBL_{33b}$. In some embodiments, each of a vertical bit lines $LBL_{11a}$-$LBL_{33b}$ includes a vertical structure (e.g., a rectangular prism, a cylinder, or a pillar), and the vertical strip of reversible resistance-switching memory material 320 may completely or partially surround the vertical structure (e.g., a conformal layer of reversible resistance-switching material surrounding the sides of the vertical structure).

Bit line select devices $GR_{11a}$-$GR_{33b}$ are disposed between local bit lines $LBL_{11a}$-$LBL_{33b}$, respectively, and associated bit line select transistors $Q_{11S}$-$Q_{33S}$, respectively. Each of bit line select devices $GR_{11a}$-$GR_{31a}$ has a first terminal coupled to a corresponding local bit line $LBL_{11a}$-$LBL_{31a}$, respectively, a second terminal (e.g., a control terminal) coupled to bit line select line $SBL_{00}$, and a third terminal coupled to a corresponding first terminal (e.g., a drain/source terminal) of associated bit line select transistors $Q_{11S}$-$Q_{31S}$, respectively. When bit line select line $SBL_{00}$ has a first voltage (e.g., LOW), each of bit line select devices $GR_{11a}$-$GR_{31a}$ has a first (e.g., HIGH) impedance, substantially no current may flow through bit line select devices $GR_{11a}$-$GR_{31a}$, and local bit lines $LBL_{11a}$-$LBL_{31a}$ are substantially disconnected from associated bit line select transistors $Q_{11S}$-$Q_{31S}$, respectively. When bit line select line $SBL_{00}$ has a second voltage (e.g., HIGH), each of bit line select devices $GR_{11a}$-$GR_{31a}$ has a second (e.g., LOW) impedance, current may flow through bit line select devices $GR_{11a}$-$GR_{31a}$, and local bit lines $LBL_{11a}$-$LBL_{31a}$ are connected to associated bit line select transistors $Q_{11S}$-$Q_{31S}$, respectively.

Each of bit line select devices $GR_{11b}$-$GR_{31b}$ has a first terminal coupled to a corresponding local bit line $LBL_{11b}$-$LBL_{31b}$, respectively, a second terminal (e.g., a control terminal) coupled to bit line select line $SBL_{01}$, and a third terminal coupled to the first terminal of associated bit line select transistors $Q_{11S}$-$Q_{31S}$, respectively. When bit line select line $SBL_{01}$ has a first voltage (e.g., LOW), each of bit line select devices $GR_{11b}$-$GR_{31b}$ has a first (e.g., HIGH) impedance, substantially no current may flow through bit line select devices $GR_{11b}$-$GR_{31b}$, and local bit lines $LBL_{11b}$-$LBL_{31b}$ are substantially disconnected from associated bit line select transistors $Q_{11S}$-$Q_{31S}$, respectively. When bit line select line $SBL_{01}$ has a second voltage (e.g., HIGH), each of bit line select devices $GR_{11b}$-$GR_{31b}$ has a second (e.g., LOW) impedance, current may flow through bit line select devices $GR_{11b}$-$GR_{31b}$, and local bit lines $LBL_{11b}$-$LBL_{31b}$ are connected to associated bit line select transistors $Q_{11S}$-$Q_{31S}$, respectively.

Each of bit line select devices $GR_{12a}$-$GR_{32a}$ has a first terminal coupled to a corresponding local bit line $LBL_{12a}$-$LBL_{32a}$, respectively, a second terminal (e.g., a control terminal) coupled to bit line select line $SBL_{01}$, and a third terminal to a corresponding first terminal (e.g., a drain/source terminal) of associated bit line select transistors $Q_{12S}$-$Q_{32S}$, respectively. When bit line select line $SBL_{01}$ has a first voltage (e.g., LOW), each of bit line select devices $GR_{32a}$-$GR_{32a}$ has a first (e.g., HIGH) impedance, substantially no current may flow through bit line select devices $GR_{12a}$-$GR_{32a}$, and local bit lines $LBL_{12a}$-$LBL_{32a}$ are substantially disconnected from associated bit line select transistors $Q_{12S}$-$Q_{32S}$, respectively. When bit line select line $SBL_{01}$ has a second voltage (e.g., HIGH), each of bit line select devices $GR_{12\ a}$-$GR_{32a}$ has a second (e.g., LOW) impedance, current may flow through bit line select devices $GR_{12a}$-$GR_{32a}$, and local bit lines $LBL_{12a}$-$LBL_{32a}$ are connected to associated bit line select transistors $Q_{12S}$-$Q_{32S}$, respectively.

Each of bit line select devices $GR_{12b}$-$GR_{32b}$ has a first terminal coupled to a corresponding local bit line $LBL_{12b}$-$LBL_{32b}$, respectively, a second terminal (e.g., a control terminal) coupled to bit line select line $SBL_{02}$, and a third terminal coupled to the first terminal of associated bit line select transistors $Q_{12S}$-$Q_{32S}$, respectively. When bit line select line $SBL_{02}$ has a first voltage (e.g., LOW), each of bit line select devices $GR_{12b}$-$GR_{32b}$ has a first (e.g., HIGH) impedance, substantially no current may flow through bit line select devices $GR_{12b}$-$GR_{32b}$, and local bit lines $LBL_{12b}$-$LBL_{32b}$ are substantially disconnected from associated bit line select transistors $Q_{12S}$-$Q_{32S}$, respectively. When bit line select line $SBL_{02}$ has a second voltage (e.g., HIGH), each of bit line select devices $GR_{12b}$-$GR_{32b}$ has a second (e.g., LOW) impedance, current may flow through bit line select devices $GR_{12b}$-$GR_{32b}$, and local bit lines $LBL_{12b}$-$LBL_{32b}$ are connected to associated bit line select transistors $Q_{12S}$-$Q_{32S}$, respectively.

Each of bit line select devices $GR_{13a}$-$GR_{33a}$ has a first terminal coupled to a corresponding local bit line $LBL_{13a}$-$LBL_{33a}$, respectively, a second terminal (e.g., a control terminal) coupled to bit line select line $SBL_{02}$, and a third terminal coupled to a corresponding first terminal (e.g., a drain/source terminal) of associated bit line select transistors $Q_{13S}$-$Q_{33S}$, respectively. When bit line select line $SBL_{02}$ has a first voltage (e.g., LOW), each of bit line select devices $GR_{13a}$-$GR_{33a}$ has a first (e.g., HIGH) impedance, substantially no current may flow through bit line select devices $GR_{13a}$-$GR_{33a}$, and local bit lines $LBL_{13a}$-$LBL_{33a}$ are substantially disconnected from associated bit line select transistors $Q_{13S}$-$Q_{33S}$, respectively. When bit line select line $SBL_{02}$ has a second voltage (e.g., HIGH), each of bit line select devices $GR_{13a}$-$GR_{33a}$ has a second (e.g., LOW) impedance, current may flow through bit line select devices $GR_{13a}$-$GR_{33a}$, and local bit lines $LBL_{13a}$-$LBL_{33a}$ are connected to associated bit line select transistors $Q_{13S}$-$Q_{33S}$, respectively.

Each of bit line select devices $GR_{13b}$-$GR_{33b}$ has a first terminal coupled to a corresponding local bit line $LBL_{13b}$-$LBL_{33b}$, respectively, a second terminal (e.g., a control terminal) coupled to bit line select line $SBL_{03}$, and a third terminal coupled to the first terminal of associated bit line select transistors $Q_{13S}$-$Q_{33S}$, respectively. When bit line select line $SBL_{03}$ has a first voltage (e.g., LOW), each of bit line select devices $GR_{13b}$-$GR_{33b}$ has a first (e.g., HIGH) impedance, substantially no current may flow through bit line select devices $GR_{13b}$-$GR_{33b}$, and local bit lines $LBL_{13b}$-$LBL_{33b}$ are substantially disconnected from associated bit line select transistors $Q_{13S}$-$Q_{33S}$, respectively. When bit line select line $SBL_{03}$ has a second voltage (e.g., HIGH), each of bit line select devices $GR_{13b}$-$GR_{33b}$ has a second (e.g., LOW) impedance, current may flow through bit line select devices $GR_{13b}$-$GR_{33b}$, and local bit lines $LBL_{13b}$-$LBL_{33b}$ are connected to associated bit line select transistors $Q_{13S}$-$Q_{33S}$, respectively.

In an embodiment, each of bit line select devices $GR_{11a}$-$GR_{33b}$ include a portion of local bit lines $LBL_{11a}$-$LBL_{33b}$, respectively, and a portion of vertical strips of reversible resistance-switching material 320. For example, bit line select device $GR_{11a}$ includes bit line select line $SBL_{00}$, vertical strip of reversible resistance-switching material 320, and a portion of local bit line $LBL_{11a}$. In an embodiment, bit line select device $GR_{11a}$ is a gated resistor (also called a junctionless transistor), with bit line select line $SBL_{00}$ as the gate, vertical strip of reversible resistance-switching material 320 as the gate oxide, and the portion of local bit line $LBL_{11a}$ as the junctionless transistor channel. Likewise, bit line select device $GR_{13b}$ includes bit line select line $SBL_{03}$, vertical strip of reversible resistance-switching material 320, and a portion of local bit line $LBL_{13b}$. In an embodiment, bit line select device $GR_{13b}$ is a gated resistor (also called a junctionless transistor), with bit line select line $SBL_{03}$ as the gate, vertical strip of reversible resistance-switching material 320 as the gate oxide, and the portion of local bit line $LBL_{13b}$ as the junctionless transistor channel.

A memory cell is disposed between the intersection of each vertical bit line and each word line. For example, a memory cell $M_{111}$ is disposed between vertical bit line $LBL_{11a}$ and word line $WL_{10}$, a memory cell $M_{116}$ is disposed between vertical bit line $LBL_{13b}$ and word line $WL_{13}$, a memory cell Man is disposed between vertical bit line $LBL_{11a}$ and word line $WL_{40}$, and so on. In an embodiment, monolithic three-dimensional memory array 300 includes seventy-two memory cells $M_{111}$, $M_{112}$, ..., $M_{436}$. Persons of ordinary skill in the art will understand that monolithic three-dimensional memory arrays may include more or fewer than seventy-two memory cells.

In an example, portions of the vertical strip of reversible resistance-switching material 320 may include a part of memory cell $M_{111}$ associated with the cross section between word line $WL_{10}$ and $LBL_{11a}$, and a part of memory cell $M_{211}$ associated with the cross section between word line $WL_{20}$ and $LBL_{11a}$.

Each of memory cells $M_{111}$, $M_{112}$, ..., $M_{436}$ may include a floating gate device, a charge trap device (e.g., using a silicon nitride material), a resistive change memory device, or other type of memory device. Vertically-oriented bit line select transistors $Q_{11}$-$Q_{33}$ may be used to select a corresponding one of vertical bit lines $LBL_{11a}$-$LBL_{33b}$. Vertically-oriented bit line select transistors $Q_{11}$-$Q_{33}$ may be field effect transistors, although other transistors types may be used.

Thus, the first gate terminal and the second gate terminal of each of vertically-oriented bit line select transistors $Q_{11}$-$Q_{33}$ may be used to turn ON and OFF vertically-oriented bit line select transistors $Q_{11}$-$Q_{3}$. Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Vertically-oriented bit line select transistors $Q_{11}$, $Q_{12}$, $Q_{13}$ are used to selectively connect/disconnect vertical bit line pairs $LBL_{11a}$ and $LBL_{11b}$, $LBL_{12a}$ and $LBL_{12b}$, and $LBL_{13a}$ and $LBL_{13b}$ to/from global bit line $GBL_1$ using row select lines $SG_1$, $SG_2$, $SG_3$, respectively. In particular, each of vertically-oriented bit line select transistors $Q_{11}$, $Q_{12}$, $Q_{13}$ has a first terminal (e.g., a drain./source terminal) coupled to a corresponding one of vertical bit line pairs $LBL_{11a}$ and $LBL_{11b}$, $LBL_{12a}$ and $LBL_{12b}$, and $LBL_{13a}$ and $LBL_{13b}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1$, $SG_2$, $SG_3$ are used to turn ON/OFF vertically-oriented bit line select transistors $Q_{11}$, $Q_{12}$, $Q_{13}$, respectively, to connect/disconnect vertical bit line pairs $LBL_{11a}$ and $LBL_{11b}$, $LBL_{12a}$ and $LBL_{12b}$, and $LBL_{13a}$ and $LBL_{13b}$, respectively, to/from global bit line $GBL_1$.

Likewise, vertically-oriented bit line select transistors $Q_{11}$, $Q_{21}$, ..., $Q_{33}$ are used to selectively connect/disconnect vertical bit line pairs $LBL_{11a}$ and $LBL_{11b}$, $LBL_{21a}$ and $LBL_{21b}$, and $LBL_{31a}$ and $LBL_{31b}$, respectively, to global bit lines $GBL_1$, $GBL_2$, $GBL_3$, respectively, using row select line $SG_1$. In particular, each of vertically-oriented bit line select transistors $Q_{11}$, $Q_{21}$, $Q_{31}$ has a first terminal (e.g., a drain./source terminal) coupled to a corresponding one of vertical bit line pairs $LBL_{11a}$ and $LBL_{11b}$, $LBL_{21a}$ and $LBL_{21b}$, and $LBL_{31a}$ and $LBL_{31b}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}$, $Q_{21}$, $Q_{31}$ to connect/disconnect vertical bit line pairs $LBL_{11a}$ and $LBL_{11b}$, $LBL_{21a}$ and $LBL_{21b}$, and $LBL_{31a}$ and $LBL_{31b}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit line pairs $LBL_{13a}$ and $LBL_{13b}$, $LBL_{23a}$ and $LBL_{23b}$, and $LBL_{33a}$ and $LBL_{33b}$, respectively to/from global bit lines $GBL_1$, $GBL_2$, $GBL_3$, respectively, using row select line $SG_3$. In particular, each of vertically-oriented bit line select transistors $Q_{13}$, $Q_{23}$, $Q_{33}$ has a first terminal (e.g., a drain./source terminal) coupled to a corresponding one of vertical bit line pairs $LBL_{13a}$ and $LBL_{13b}$, $LBL_{23a}$ and $LBL_{23b}$, and $LBL_{33a}$ and $LBL_{33b}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}$, $Q_{23}$, $Q_{33}$ to connect/disconnect vertical bit line pairs $LBL_{13a}$ and $LBL_{13b}$, $LBL_{23a}$ and $LBL_{23b}$, and $LBL_{33a}$ and $LBL_{33b}$, respectively, to/from global bit lines $GBL_1$, $GBL_2$, $GBL_3$, respectively.

As described above, in an embodiment, dummy word lines may be used as bit line select lines $SBL_{00}$, $SBL_{01}$, $SBL_{02}$, $SBL_{03}$. Bit line select lines $SBL_{00}$, $SBL_{01}$, $SBL_{02}$, $SBL_{03}$ are used in conjunction with row select lines $SG_1$, $SG_2$, $SG_3$ to connect/disconnect vertical bit lines $LBL_{11a}$, $LBL_{11b}$, $LBL_{12a}$, $LBL_{12b}$, $LBL_{13a}$ and $LBL_{13b}$ to/from global bit line $GBL_1$.

Bit line select lines $SBL_{01}$, $SBL_{02}$, $SBL_{03}$ and word lines $WL_{10}$, $WL_{11}$, ..., $WL_{43}$ may be made of the same material or may be made of different materials. For example, in an embodiment, bit line select lines $SBL_{01}$, $SBL_{02}$, $SBL_{03}$ may be made of a first material (e.g., p+ polysilicon), and word lines $WL_{10}$, $WL_{11}$, ..., $WL_{43}$ may be made of a second material (e.g., titanium nitride). Other materials values may be used.

Bit line select lines $SBL_{01}$, $SBL_{02}$, $SBL_{03}$ and word lines $WL_{10}$, $WL_{11}$, ..., $WL_{43}$ each may have the same (vertical) thickness or may have different thicknesses. For example, in an embodiment, each of bit line select lines $SBL_{01}$, $SBL_{02}$, $SBL_{03}$ has a first thickness between about 50 angstroms and about 800 angstroms, and each of word lines $WL_{10}$, $WL_{11}$, ..., $WL_{43}$ has a second thickness between about 50 angstroms and about 400 angstroms. Other thickness values may be used.

Likewise, bit line select line $SBL_{00}$ is used in conjunction with row select line $SG_1$ to connect/disconnect vertical bit lines $LBL_{11a}$, $LBL_{21a}$ and $LBL_{31a}$ to/from global bit lines $GBL_1$, $GBL_2$ and $GBL_3$, respectively. Similarly, bit line select line $SBL_{03}$ is used in conjunction with row select line $SG_3$ to connect/disconnect vertical bit lines $LBL_{13b}$, $LBL_{23b}$ and $LBL_{33b}$ to/from global bit lines $GBL_1$, $GBL_2$ and $GBL_3$, respectively.

Referring now to FIGS. 4A1-4F3, an example method of forming a monolithic three-dimensional memory array, such as monolithic three-dimensional array 300 of FIGS. 3A-3E, is described.

With reference to FIGS. 4A1-4A3, substrate 302 is shown as having already undergone several processing steps. Substrate 302 may be any suitable substrate such as a silicon, germanium, silicon-germanium, undoped, doped, bulk, silicon-on-insulator ("SOI") or other substrate with or without additional circuitry. For example, substrate 302 may include one or more n-well or p-well regions (not shown). Isolation layer 304 is formed above substrate 302. In some embodiments, isolation layer 304 may be a layer of silicon dioxide, silicon nitride, silicon oxynitride or any other suitable insulating layer.

Following formation of isolation layer 304, a conductive material layer 306 is deposited over isolation layer 304. Conductive material layer 306 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 306 may comprise between about 200 and about 2500 angstroms of tungsten. Other conductive material layers and/or thicknesses may be used. In some embodiments, an adhesion layer (not shown), such as titanium nitride or other similar adhesion layer material, may be disposed between isolation layer 304 and conductive material layer 306, and/or between conductive material layer 306 and subsequent vertically-oriented bit line select transistors layers.

Persons of ordinary skill in the art will understand that adhesion layers may be formed by PVD or another method on conductive material layers. For example, adhesion layers may be between about 20 and about 500 angstroms, and in some embodiments about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 306, conductive material layer 306 is patterned and etched. For example, conductive material layer 306 may be patterned and etched using conventional lithography techniques, with a soft or hard mask, and wet or dry etch processing. In at least one embodiment, conductive material layer 306 is patterned and etched to form global bit lines $GBL_1$, $GBL_2$, $GBL_3$. Example widths for global bit lines $GBL_1$, $GBL_2$, $GBL_3$ and/or spacings between global bit lines $GBL_1$, $GBL_2$, $GBL_3$ range between about 480 angstroms and about 1000 angstroms, although other conductor widths and/or spacings may be used.

After global bit lines $GBL_1$, $GBL_2$, $GBL_3$ have been formed, a first dielectric material layer 308 is formed over substrate 302 to fill the voids between global bit lines $GBL_1$, $GBL_2$, $GBL_3$. For example, approximately 3000-7000 angstroms of silicon dioxide may be deposited on the substrate 302 and planarized using chemical mechanical polishing or an etchback process to form a planar surface 400. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, $GBL_3$ may be formed using a damascene process in which first dielectric material layer 308 is formed, patterned and etched to create openings or voids for global bit lines $GBL_1$, $GBL_2$, $GBL_3$. The openings or voids then may be filled with conductive layer 306 (and/or a conductive seed, conductive fill and/or barrier layer if needed). Conductive material layer 306 then may be planarized to form planar surface 400.

Following planarization, the semiconductor material used to form vertically-oriented bit line select transistors $Q_{11}$-$Q_{33}$ is formed over planar surface 400 of substrate 302. In some embodiments, each vertically-oriented bit line select transistor is formed from a polycrystalline semiconductor material such as polysilicon, an epitaxial growth silicon, a polycrystalline silicon-germanium alloy, polygermanium or any other suitable material. Alternatively, vertically-oriented bit line select transistors $Q_{11}$-$Q_{33}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor $Q_{11}$-$Q_{33}$ may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ polysilicon layer 402 may be deposited on planar surface 400. In some embodiments, n+ polysilicon layer 402 is in an amorphous state as deposited. In other embodiments, n+ polysilicon layer 402 is in a polycrystalline state as deposited. CVD or another suitable process may be employed to deposit n+ polysilicon layer 402.

In an embodiment, n+ polysilicon layer 402 may be formed, for example, from about 50 angstroms to about 1000 angstroms, of phosphorus or arsenic doped silicon having a doping concentration of from $10^{18}$ cm$^{-3}$ to about $10^{21}$ cm$^{-3}$. Other layer thicknesses, doping types and/or doping concentrations may be used. N+ polysilicon layer 402 may be doped in situ, for example, by flowing a donor gas during deposition. Other doping methods may be used (e.g., implantation).

After deposition of n+ silicon layer 402, a doped p-type silicon layer 404 may be formed over n+ polysilicon layer 402. P-type silicon may be either deposited and doped by ion implantation or may be doped in situ during deposition to form a p-type silicon layer 404. For example, an intrinsic silicon layer may be deposited on n+ polysilicon layer 402, and a blanket p-type implant may be employed to implant boron a predetermined depth within the intrinsic silicon layer. Example implantable molecular ions include $BF_2$, $BF_3$, B and the like. In some embodiments, an implant dose of about 1-10×$10^{13}$ ions/cm$^2$ may be employed. Other implant species and/or doses may be used. Further, in some embodiments, a diffusion process may be employed. In an embodiment, the resultant p-type silicon layer 404 has a thickness of from about 800 angstroms to about 3000 angstroms, although other p-type silicon layer sizes may be used.

Following formation of p-type silicon layer 404, a heavily doped n+ polysilicon layer 406 is deposited on p-type silicon layer 404. In some embodiments, n+ polysilicon layer 406 is in an amorphous state as deposited. In other embodiments, n+ polysilicon layer 406 is in a polycrystalline state as deposited. CVD or another suitable process may be employed to deposit n+ polysilicon layer 406.

In an embodiment, n+ polysilicon layer 406 may be formed, for example, from about 50 angstroms to about 500 angstroms of phosphorus or arsenic doped silicon having a doping concentration of about $10^{21}$ cm$^{-3}$. Other layer thicknesses, doping types and/or doping concentrations may be used. N+ polysilicon layer 406 may be doped in situ, for example, by flowing a donor gas during deposition. Other doping methods may be used (e.g., implantation). Persons of ordinary skill in the art will understand that silicon layers 402, 404 and 406 alternatively may be doped p+/n/p+, respectively, or may be doped with a single type of dopant to produce junctionless-FETs.

Following formation of n+ polysilicon layer 406, silicon layers 402, 404 and 406 are patterned and etched to form vertical transistor pillars. For example, silicon layers 402, 404 and 406 may be patterned and etched using conventional lithography techniques, with wet or dry etch processing. In an embodiment, silicon layers 402, 404 and 406 are patterned and etched to form vertical transistor pillars disposed above global bit lines $GBL_1$, $GBL_2$, $GBL_3$. The vertical transistor pillars will be used to form vertically-oriented bit line select transistors $Q_{11}$-$Q_{33}$.

Silicon layers 402, 404 and 406 may be patterned and etched in a single pattern/etch procedure or using separate pattern/etch steps. Any suitable masking and etching process may be used to form vertical transistor pillars. For example, silicon layers may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, the vertical transistor pillars may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A gate dielectric material layer 314 is deposited conformally over substrate 302, and forms on sidewalls of the vertical transistor pillars. For example, between about 30 angstroms to about 100 angstroms of silicon dioxide may be deposited. Other dielectric materials such as silicon nitride, silicon oxynitride, low K dielectrics, etc., and/or other dielectric material layer thicknesses may be used.

Gate electrode material is deposited over the vertical transistor pillars and gate dielectric material layer 314 to fill the voids between the vertical transistor pillar. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines $SG_1$, $SG_2$, $SG_3$.

A second dielectric material layer 310 is deposited over substrate 302. For example, approximately 5000 to about 8000 angstroms of silicon dioxide may be deposited and planarized using chemical mechanical polishing or an etch-back process to form planar top surface 408, resulting in the structure shown in FIGS. 4A1-4A3. Other dielectric materials and/or thicknesses may be used.

Planar surface 408 includes exposed top surfaces of vertically-oriented bit line select transistors $Q_{11}$-$Q_{33}$ and gate dielectric material layer 314 separated by second dielectric material layer 310. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Alternating layers of third dielectric material layer 316 and a conductive material layer 410 are formed over planar top surface 408. In an embodiment, each third dielectric material layer 316 may be between about 100 angstroms and about 500 angstroms of $SiO_2$, and each conductive material layer 410 may be between about 100 angstroms and about 400 angstroms of titanium nitride. Other dielectric materials and/or thicknesses and other conductive materials and/or thicknesses may be used.

In an embodiment, five conductive material layers 410 are formed over substrate 302. More or fewer than five conductive material layers 410 may be used.

All five conductive material layers 410 may be made of the same material and same thickness, or may be made of different materials and different thicknesses. In an embodiment, a first conductive material layer 410a may be made of a first material (e.g., p+ polysilicon) and have a first thickness between about 100 angstroms and about 800 angstroms, and the other conductive material layers 410 disposed above first conductive material layer 410a may be made of a second material (e.g., titanium nitride) and have a second thickness between about 100 angstroms and about 400 angstroms. Other materials and thicknesses may be used.

Next, an etch stop layer 318 is formed over substrate 302, resulting in the structure shown in FIGS. 4B1-4B3. Etch stop layer 318 may include any suitable etch stop layer formed by any suitable method (e.g., CVD, PVD, etc.). In an embodiment, etch stop layer 318 may be between about 50 angstroms and about 500 angstroms of silicon nitride. Other etch stop layer materials and/or thicknesses may be used.

Next, etch stop layer 318, third dielectric material layers 316, and conductive material layers 410 and 410a are patterned and etched to form rows 412 of multi-layer word lines $WL_{10}$, $WL_{11}$, ..., $WL_{43}$ and bit line select lines $SBL_{00}$-$SBL_{03}$, with voids 414 separating adjacent word lines and bit line select lines, resulting in the structure shown in FIGS. 4C1-4C3. Each of rows 412 of word lines $WL_{10}$, $WL_{11}$, ..., $WL_{43}$ and bit line select lines $SBL_{00}$-$SBL_{03}$ may be between about 200 angstroms and about 1000 angstroms wide, although other widths may be used. Voids 414 may be between about 100 angstroms and about 800 angstroms wide, although other widths may be used.

A nonvolatile memory material layer 320 is deposited conformally over rows 412. Non-volatile memory material 320 may include, for example, an oxide layer, a reversible resistance-switching material (e.g., a metal oxide layer such as nickel oxide, hafnium oxide, or other similar metal oxide material, a phase change material or other similar reversible resistance-switching material), or a charge trapping layer (e.g., a layer of silicon nitride).

For example, between about 20 angstroms to about 1000 angstroms of hafnium oxide ($HfO_2$) may be deposited. Other nonvolatile memory materials such as $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$, or other suitable nonvolatile memory materials, etc., and/or other nonvolatile memory material layer thicknesses may be used. Nonvolatile memory material layer 320 may be a single layer of a single nonvolatile memory material, or may be multiple layers of one or more nonvolatile memory materials.

An anisotropic etch is used to remove lateral portions of nonvolatile memory material layer 320, leaving only sidewall portions of nonvolatile memory material layer 320, and exposing top surfaces of bit line select transistors $Q_{11}$-$Q_{31}$, resulting in the structure shown in FIGS. 4D1-4D3.

A semiconductor material layer 416 is deposited over substrate 302. In some embodiments, semiconductor material layer 416 may be formed from a polycrystalline semiconductor material such as polysilicon, an epitaxial growth silicon, a polycrystalline silicon-germanium alloy, polygermanium or any other suitable material. Alternatively, semiconductor material layer 416 may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In an embodiment, semiconductor material layer 416 may be an n+ polysilicon layer formed, for example, from about 30 angstroms to about 200 angstroms of phosphorus or arsenic doped silicon having a doping concentration of between about $10^{18}$ cm$^{-3}$ to about $10^{21}$ cm$^{-3}$. Other layer thicknesses, doping types and/or doping concentrations may be used. N+ semiconductor material layer 416 may be doped in situ, for example, by flowing a donor gas during deposition. Other doping methods may be used (e.g., implantation). For simplicity, semiconductor material layer 416 will be referred to as n+ material layer 416.

An anisotropic etch is used to remove lateral portions of n+ material layer 416, leaving only sidewall portions of n+ material layer 416, and exposing top surfaces of bit line select transistors $Q_{11}$-$Q_{31}$, resulting in the structure shown in FIGS. 4E1-4E3.

N+ material layer 416 and nonvolatile memory material layer 320 are then patterned and etched to form vertical bit lines $LBL_{11a}$-$LBL_{33b}$. A dielectric material 322, such as silicon dioxide, may then be deposited over substrate 302, filling the voids between vertical bit lines $LBL_{11a}$-$LBL_{33b}$, and then planarized using chemical mechanical polishing or an etch-back process, resulting in the structure shown in FIGS. 4F1-4F3.

Thus, as described above, one embodiment of the disclosed technology includes a method that includes forming a first vertical bit line disposed in a first direction above a substrate, forming a first word line disposed in a second direction above the substrate, the second direction perpendicular to the first direction, forming a first memory cell comprising a nonvolatile memory material at an intersection of the first vertical bit line and the first word line, forming a transistor above the substrate, and forming a first bit line select device coupled between the first vertical bit line and the transistor.

One embodiment of the disclosed technology includes a method including forming a plurality of vertical bit lines disposed in a first direction above a substrate, forming a plurality of first word lines disposed in a second direction above the substrate, the second direction perpendicular to the first direction, forming a first memory level comprising a plurality of memory cells, each memory cell comprising a nonvolatile memory material disposed at an intersection of one of the vertical bit lines and a corresponding one of the first word lines, and forming a plurality of transistors above the substrate, each of the transistors coupled to a corresponding two of the vertical bit lines. Each of the vertical bit lines is coupled to only one memory cell on the first memory level.

One embodiment of the disclosed technology includes an apparatus including a monolithic three-dimensional memory array that includes a vertical bit line disposed in a first direction above a substrate, a word line disposed in a second direction above the substrate, the second direction perpendicular to the first direction, a memory cell comprising a nonvolatile memory material at an intersection of the vertical bit line and the word line, a transistor above the substrate, and a bit line select device coupled between the vertical bit line and the transistor. The bit line select devices includes any of a gated resistor and a junctionless transistor.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
    forming a first vertical bit line disposed in a first direction above a substrate;
    forming a first word line disposed in a second direction above the substrate, the second direction perpendicular to the first direction;
    forming a first memory cell comprising a nonvolatile memory material at an intersection of the first vertical bit line and the first word line;
    forming a transistor above the substrate; and
    forming a first bit line select device coupled between the first vertical bit line and the transistor.

2. The method of claim 1, wherein the first bit line select device comprises any of a gated resistor and a junctionless transistor.

3. The method of claim 1, wherein the first bit line select device comprises a portion of the first vertical bit line.

4. The method of claim 1, wherein the first bit line select device comprises the nonvolatile memory material.

5. The method of claim 1, wherein transistor comprises a vertical transistor.

6. The method of claim 1, further comprising:
    forming a second vertical bit line disposed in the first direction above the substrate;
    forming a second word line disposed in the second direction above the substrate;
    forming a second memory cell comprising a nonvolatile memory material at an intersection of the second vertical bit line and the second word line; and
    forming a second bit line select device coupled between the second vertical bit line and the transistor.

7. The method of claim 6, wherein the second bit line select device comprises any of a gated resistor and a junctionless transistor.

8. The method of claim 6, wherein the second bit line select device comprises a portion of the second vertical bit line.

9. The method of claim 1, wherein the nonvolatile memory material comprise one of a reversible resistance-switching material, a phase change material, and a charge trapping layer.

10. The method of claim 1, wherein the nonvolatile memory material comprise one or more of $HfO_2$, $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$.

11. A method comprising:
    forming a plurality of vertical bit lines disposed in a first direction above a substrate;
    forming a plurality of first word lines disposed in a second direction above the substrate, the second direction perpendicular to the first direction;
    forming a first memory level comprising a plurality of memory cells, each memory cell comprising a nonvolatile memory material disposed at an intersection of one of the vertical bit lines and a corresponding one of the first word lines; and
    forming a plurality of transistors above the substrate, each of the transistors coupled to a corresponding two of the vertical bit lines,
    wherein each of the vertical bit lines is coupled to only one memory cell on the first memory level.

12. The method of claim 11, further comprising forming a plurality of bit line select devices, each bit line select device coupled between one of the vertical bit lines and a corresponding one of the transistors.

13. The method of claim 12, wherein each bit line select device comprises any of a gated resistor and a junctionless transistor.

14. The method of claim 12, wherein each bit line select device comprises a portion of the one of the vertical bit lines.

15. The method of claim 12, wherein each bit line select device comprises the nonvolatile memory material.

16. The method of claim 11, wherein each transistor comprises a vertical transistor.

17. The method of claim 11, wherein the nonvolatile memory material comprise one of a reversible resistance-switching material, a phase change material, and a charge trapping layer.

18. The method of claim 11, wherein the nonvolatile memory material comprise one or more of $HfO_2$, $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$.

19. An apparatus comprising:
    a monolithic three-dimensional memory array comprising:
    a vertical bit line disposed in a first direction above a substrate;
    a word line disposed in a second direction above the substrate, the second direction perpendicular to the first direction;
    a memory cell comprising a nonvolatile memory material at an intersection of the vertical bit line and the word line;
    a transistor above the substrate; and
    a bit line select device coupled between the vertical bit line and the transistor, wherein the bit line select devices comprises any of a gated resistor and a junctionless transistor.

20. The apparatus of claim 19, wherein the nonvolatile memory material comprise one or more of $HfO_2$, $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$.

* * * * *